US012750967B2

(12) United States Patent
Xiong

(10) Patent No.: US 12,750,967 B2
(45) Date of Patent: Sep. 29, 2026

(54) HIGH-PERFORMANCE POWER SUPPLY MODULE

(71) Applicant: MetaPWR Electronics Co., Ltd., Shanghai (CN)

(72) Inventor: Yahong Xiong, Shanghai (CN)

(73) Assignee: MetaPWR Electronics Co., Ltd., Shanghai (CN)

( * ) Notice: Subject to any disclaimer, the term of this patent is extended or adjusted under 35 U.S.C. 154(b) by 146 days.

(21) Appl. No.: 18/916,748

(22) Filed: Oct. 16, 2024

(65) Prior Publication Data

US 2025/0126735 A1 Apr. 17, 2025

(30) Foreign Application Priority Data

Oct. 16, 2023 (CN) ......................... 202311336502.7
Oct. 22, 2023 (CN) ......................... 202311367696.7

(51) Int. Cl.

| | |
|---|---|
| ***H01H 47/00*** | (2006.01) |
| ***H01F 27/06*** | (2006.01) |
| ***H01F 27/28*** | (2006.01) |
| ***H05K 7/14*** | (2006.01) |
| ***H10W 70/60*** | (2026.01) |
| ***H10W 90/00*** | (2026.01) |
| *H10D 1/20* | (2025.01) |
| *H10D 1/68* | (2025.01) |

(52) U.S. Cl.

CPC ............... *H05K 7/14* (2013.01); *H01F 27/06* (2013.01); *H01F 27/28* (2013.01); *H10W 70/611* (2026.01); *H10W 90/00* (2026.01); *H10W 90/401* (2026.01); *H10D 1/20* (2025.01); *H10D 1/68* (2025.01); *H10W 90/701* (2026.01)

(58) Field of Classification Search

CPC ........................................................ H05K 7/14
See application file for complete search history.

(56) References Cited

U.S. PATENT DOCUMENTS

| | | | | |
|---|---|---|---|---|
| 10,158,357 | B1 * | 12/2018 | Vinciarelli | H02M 3/33576 |
| 2015/0081131 | A1 * | 3/2015 | Simonelli | H05K 5/00 700/298 |
| 2019/0254166 | A1 * | 8/2019 | Ji | H05K 1/181 |
| 2021/0385938 | A1 * | 12/2021 | Lau | H05K 1/0203 |
| 2024/0431029 | A1 * | 12/2024 | Zeng | H05K 1/181 |

* cited by examiner

*Primary Examiner* — Stephen W Jackson
(74) *Attorney, Agent, or Firm* — JCIPRNET

(57) ABSTRACT

A high-performance power supply module including at least one voltage regulating unit is provided. The voltage regulating unit comprises an SPS combination, a four-phase anti-coupling inductor, an output capacitor assembly, a first substrate and a second substrate, the SPS combination and the four-phase coupling inductor are respectively arranged on two opposite surfaces of the first substrate, the SPS combination comprises four smart power stages, the four smart power stages are arranged according to four-blade windmill shapes, and the four smart power stages are matched with the four-phase coupling inductor structure. The output capacitor assembly is arranged on one surface of the second substrate; and a groove is formed in the bottom surface of the four-phase coupling inductor.

19 Claims, 19 Drawing Sheets

HIGH-PERFORMANCE POWER SUPPLY MODULE

CROSS-REFERENCE TO RELATED APPLICATIONS

This application claims the priority benefit of China application serial no. 202311336502.7 filed on Oct. 16, 2023, and China application serial no. 202311367696.7 filed on Oct. 22, 2023. The entirety of each of the above-mentioned patent applications is hereby incorporated by reference herein and made a part of this specification.

TECHNICAL FIELD

The invention relates to a high-frequency power supply, in particular to a high-performance power supply module.

DESCRIPTION OF RELATED ART

In recent years, with the development of technologies such as data centers, artificial intelligence, supercomputers and the like, more and more ASIC with powerful functions are applied, such as a CPU, a GPU, a machine learning accelerator chip, a network switch chip, a server chip and the like, which consume a large amount of current, for example, reach thousands of amperes, and the power supply current needs to be rapidly jumped. A voltage regulator module (VRM, Voltage Regulator Modules) consisting of Buck circuits (Buck) is conventionally used to supply such loads.

With the progress of the semiconductor technology, the voltage of these loads becomes lower and lower, and the current of the load is continuously increased. In the power supply module with low-voltage and high-current output, how to improve the conversion efficiency, how to reduce the parasitic parameters between the load and the ASIC load, how to improve the dynamic response capability, reduce the module volume and form a key for meeting the requirements of the ASIC power supply application is also a core problem of the design of the power supply module. The power supply module is placed on the back face of the system board and supplies power to the ASIC located on the front face of the system board, that is, vertical power supply is achieved, and parasitic parameters between the power supply module and the ASIC load can be reduced.

Therefore, how to reduce the area and volume of the power supply module for vertical power supply and improve the dynamic response performance of the power supply module is an urgent problem to be solved.

SUMMARY

In view of the above, one of the objectives of the present application is to provide a high-performance power supply module comprises at least one voltage regulating unit; the voltage regulating unit comprises an SPS combination, a four-phase anti-coupling inductor, an output capacitor assembly, a first substrate and a second substrate; the first substrate comprises a first surface and a second surface which are opposite to each other, and the second substrate comprises a first surface and a second surface which are opposite to each other.

The SPS combination is arranged on the first surface of the first substrate, and the four-phase coupling inductor is arranged between the second surface of the first substrate and the first surface of the second substrate; the output capacitor assembly is arranged on the second surface of the second substrate.

The SPS combination comprises four smart power stages, the four smart power stages are arranged according to four-leaf windmill shapes, each smart power stage comprises a voltage-jump pin, and each voltage-jump pin is arranged at the top end of the corresponding windmill blade.

The four-phase anti-coupling inductor comprises a magnetic core and an inductor frame, a groove space is provided between the surface of the magnetic core and the surface of the frame, and at least a part of the groove space is used for accommodating the output capacitor assembly.

Preferably, wherein the smart power stage further comprises an input positive pin, a grounding pin and a signal pin, the voltage-jump pin, the input positive pin, the grounding pin and the signal pin are sequentially arranged in the same direction.

Preferably, the high-performance power supply module, further comprising an input capacitor, wherein the input capacitor is provided with two sides of the smart power stage and is arranged adjacent to the input positive pin and the grounding pin.

Preferably, the inductance frame comprises four inductor windings, a grounding electrical connector, an input positive electrical connector, an output positive electrical connector and a jump connector; one end of each inductor winding is connected with the corresponding output positive electrical connector, and the other end of each inductor winding is connected with the corresponding jump connector;

Each of the output positive electrical connectors is disposed adjacent to a jump electrical connector corresponding to another inductive winding.

Preferably, the inductor frame is quadrilateral, and the inductor frame further comprises a grounding pad, an input positive pad, an output positive pad and a jump pad; a grounding pad, an input positive pad, an output positive pad, a jump pad, an input positive pad and a grounding pad are sequentially arranged each sides of the top surface of the inductor frame.

A ground pad, an input positive pad, an output positive pad, an input positive pad, and a ground pad are sequentially arranged on four sides of the bottom surface of the inductor frame.

Preferably, the smart power stage further comprises an input positive pin, a grounding pin and a signal pin, the voltage-jump pin, the input positive pin, the grounding pin and the signal pin are sequentially arranged in the same direction, and the projection of the jump bonding pad on the first surface of the first substrate at least partially coincides with the projection of the voltage-jump pin on the first surface of the first substrate.

Preferably, the high-performance power supply module further comprises a ball grid array, the ball grid array is arranged on the second surface of the second substrate, and the ball grid array is electrically connected with the grounding electrical connector, the input positive electrical connector and the output positive electrical connector through a second substrate.

Preferably, the inductor windings corresponding to the voltage regulating units are integrated in a third substrate; and the magnetic cores corresponding to the voltage regulating units are all buckled on the third substrate.

Preferably, each SPS combination is provided with four pulse width modulation signals, and each pulse width modulation signal is used for controlling one smart power stage; and the four pulse width modulation signals are sequentially staggered by 90 degrees, and the duty ratio of the four pulse width modulation signals is within the range of 15%-35%.

Preferably, the voltage regulating unit is six voltage regulating units which are respectively a first voltage regulating unit to a sixth voltage regulating unit, the input ends of the six voltage regulating units are electrically connected in parallel, the output ends of the first voltage regulating unit to the fourth voltage regulating unit are electrically connected in parallel to form a first power supply path, the fifth voltage regulating unit forms a second power supply path, and the sixth voltage regulating unit forms a third power supply path.

Preferably, the high-performance power supply module comprises a first side face, a second side face, a third side face and a fourth side face, the first side face and the third side face are opposite, and the second side face and the fourth side face are opposite; the first voltage regulation unit and the second voltage regulation unit are arranged adjacent to the first side face; the third voltage regulation unit and the fourth adjusting unit are arranged close to the third side face; the fifth voltage regulation unit is arranged between the first voltage regulation unit and the third voltage regulation unit and is adjacent to the second side face; and the sixth voltage regulation unit is arranged between the second voltage regulation unit and the fourth voltage regulation unit and is arranged adjacent to the fourth side face.

Preferably, the high-performance power supply module is further provided with a controller, and the controller is arranged in a groove space corresponding to the voltage regulation unit corresponding to the first power supply path.

Preferably, the high-performance power supply module further comprises two single-phase voltage reduction units; the single-phase voltage reduction units respectively form a power supply path; the single-phase voltage reduction units respectively include one smart power stage; and the single-phase voltage reduction units respectively include one single-phase inductor, or the single-phase voltage reduction units share one two-phase inductor.

Preferably, the voltage regulation unit is five voltage regulation units which are respectively a first voltage regulation unit to a fifth voltage regulation unit, the input ends of the five voltage regulation units are electrically connected in parallel, the output ends of the first voltage regulation unit to the fourth voltage regulation unit are electrically connected in parallel to form a first power supply path, and the fifth voltage regulation unit forms a second power supply path.

The high-performance power supply module further comprises a two-phase parallel voltage reduction unit and two single-phase voltage reduction units; and the two-phase parallel voltage reduction unit forms a third power supply path, the two-phase parallel voltage reduction unit comprises two smart power stages and one two-phase anti-coupling inductor; the two smart power stages are provided with two pulse width modulation signals, and the two pulse width modulation signals are staggered by 180 degrees; the input ends of the two anti-coupling inductors are electrically connected with the two smart power stages respectively.

The high-performance power supply module further comprises two single-phase voltage reduction units; the single-phase voltage reduction units respectively form a power supply path; the single-phase voltage reduction units respectively include one smart power stage; and the single-phase voltage reduction units respectively include one single-phase inductor, or the single-phase voltage reduction units share one two-phase inductor.

Preferably, the fifth voltage regulation unit is arranged in the middle of the high-performance power supply module, and the first voltage regulation unit to the fourth voltage regulation unit are arranged around the fifth voltage regulation unit.

Preferably, the high-performance power supply module also includes two controllers, the two controllers are arranged on the two faces of the first substrate respectively, and the projection of the two controllers on the top surface of the first substrate coincide or partially overlap.

Preferably, the two controllers, the fifth voltage regulating unit and the two-phase parallel voltage reduction unit are arranged along the center line of the high-performance power supply module, and the first voltage regulating unit to the fourth voltage regulating unit and the two single-phase voltage reduction units are symmetrically arranged on two sides of the center line.

Preferably, wherein inductors corresponding to the voltage regulating unit, the two-phase parallel voltage reduction unit and the single-phase voltage reduction unit respectively include the inductor winding and the magnetic core, the windings are all integrated in one third substrate, and the magnetic cores are all buckled on the third substrate.

Preferably, the high-performance power supply module, further comprising a signal electrical connector, the signal electrical connector being disposed between the first substrate and the second substrate and electrically connected to the first substrate and the second substrate, and the signal electrical connector being used for transmitting a signal.

Compared with the prior art, the application has the following beneficial effects:

The application provides a high-performance power supply module structure. Through the layout of four smart power stages SPS, the structure of a four-phase anti-coupling inductor and the setting of an output capacitor are combined, so that the small area, the small size and the high dynamic response performance of the power supply module are realized.

DESCRIPTION OF THE EMBODIMENTS

Figure 1A:
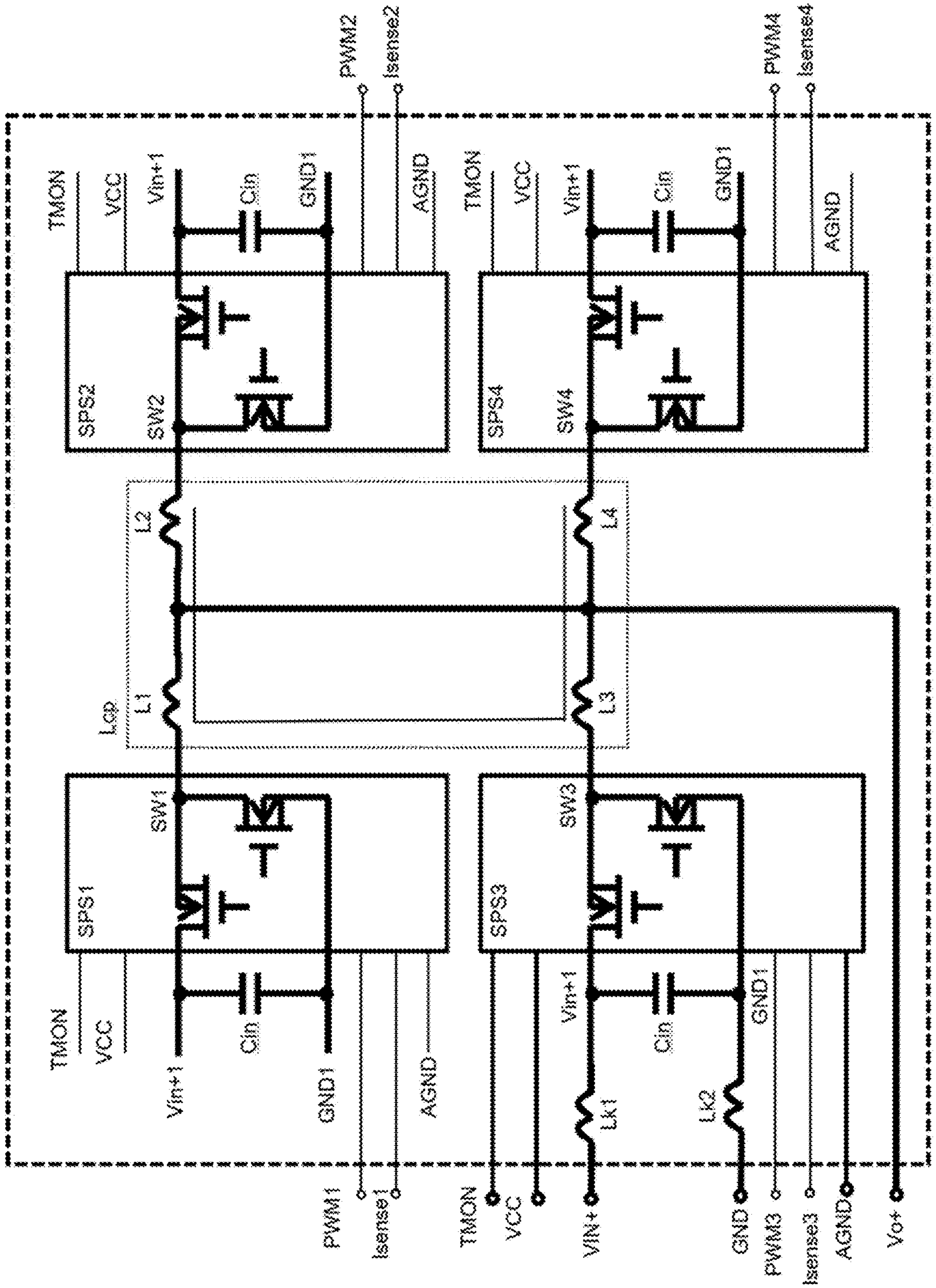
FIG. 1A is a circuit block diagram of a voltage regulating unit formed in parallel with a multi-phase Buck circuit.

The present application discloses various embodiments or examples of implementing the thematic technological schemes mentioned. To simplify the disclosure, specific instances of each element and arrangement are described below. However, these are merely examples and do not limit the scope of protection of this application. For instance, a first feature recorded subsequently in the specification formed above or on top of a second feature may include an embodiment where the first and second features are formed through direct contact, or it may include an embodiment where additional features are formed between the first and second features, allowing the first and second features not to be directly connected. Additionally, these disclosures may repeat reference numerals and/or letters in different examples. This repetition is for brevity and clarity and does not imply a relationship between the discussed embodiments and/or structures. Furthermore, when a first element is described as being connected or combined with a second element, this includes embodiments where the first and second elements are directly connected or combined with each other, as well as embodiments where one or more intervening elements are introduced to indirectly connect or combine the first and second elements.

Embodiment 1

Figure 1B:
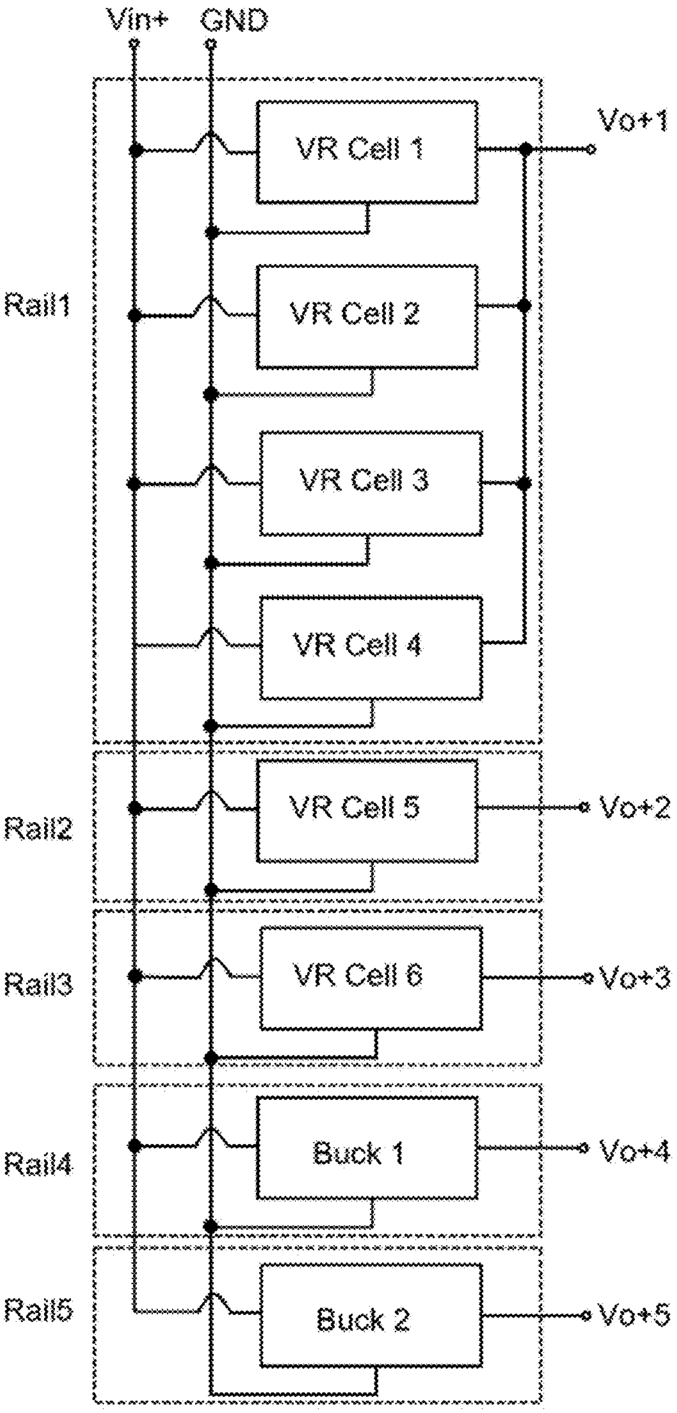
FIG. 1B is a circuit block diagram of a power supply module composed of a plurality of voltage regulating units.

As shown in FIG. 1A and FIG. 1B, as shown in FIG. 1A, a circuit block diagram of a voltage regulating unit comprising a multi-phase Buck circuit in parallel according to the present application is disclosed. FIG. 1B is a circuit block diagram of a power supply module composed of a plurality of voltage regulating units. The high-performance power supply module shown in FIG. 1B comprises five power supply paths which are respectively a first power supply path Rail 1 to a fifth power supply path Rail 5 (hereinafter referred to as Rail for short). The high-performance power supply module shown in FIG. 1B further comprises an input positive end Vin+, an output positive end Vo+ and a grounding end GND. The input end of the first power supply path Rail 1 is electrically connected with the input positive end Vin+ and the grounding end GND, and the output end is an output positive end Vo+1 and a grounding end GND respectively; the first power supply path Rail 1 comprises four voltage regulation units VR Cell 1 to VR Cell 4 (Voltage Regulator Cell, hereinafter referred to as VR Cell for short). The input end of the second power supply path rail 2 is electrically connected with the input positive end Vin+ and the grounding end GND, and the output end is an output positive end Vo+2 and a grounding end GND respectively; the second power supply path Rail 2 comprises a VR Cell 5 third power supply path Rail 3, the input end of the third power supply path Rail 3 is electrically connected with the input positive end Vin+ and the grounding end GND, and the output end is an output positive end Vo+3 and a grounding end GND respectively; and the Rail 3 comprises a VR Cell 6; the input end of the fourth power supply path rail 4 is electrically connected with the input positive end Vin+ and the grounding end GND, and the output end is an output positive end Vo+4 and the grounding end GND; the fourth power supply path Rail 4 comprises a single-phase Buck unit Buck 1. The fifth power supply path Rail 5 comprises an input positive end Vin+ and a grounding end GND which are electrically connected with the input end of the fifth power supply path Rail 5 of the single-phase voltage reduction unit Buck 1, and the output end is an output positive end Vo+5 and a grounding end GND respectively; and the fifth power supply path Rail 5 comprises a single-phase voltage reduction unit Buck 2.

Referring to FIG. 1A, each VR Cell includes four smart power stages SPS1 to SPS4 (SPS), four inductors L1 to L4, and four input capacitors Cin. Each VR Cell comprises three power ends which are respectively an input positive end Vin+, an output positive end Vo+ and a grounding end GND. Each SPS comprises an internal input positive end Vin+1, an internal ground terminal Gnd1 and a voltage-jump terminal SW. A filter inductor Lk1 is connected in series between the input positive end Vin+ of the VR Cell and the internal input positive end Vin+1, and a filter inductor Lk2 is connected in series between the ground terminal GND of the VR Cell and the internal ground terminal Gnd1. The filter inductors LK1 and LK2 are parasitic inductance on the VR Cell pins. In the same VR Cell, the internal input positive ends Vin+1 of the four SPSs are short-circuited together, the internal grounding terminal GND1 of the four SPSss are also short-circuited together, each voltage-jump terminal of the four SPSs are the SW1 to SW4 respectively. Each end of the inductors L1 to L4 is electrically connected with the voltage-jump terminals SW1 to SW4 respectively, and the other ends of the inductors L1 to L4 are electrically connected with the output positive end Vo+ of the VR Cell. The capacitor Cin is bridged between the internal input positive end Vin+1 and the internal grounding end GND 1.

Each smart power stage SPS comprises a half-bridge arm, the half-bridge arm is bridged between the internal input positive end Vin+1 and the internal grounding end GND1, and the midpoint of the half-bridge arm is electrically connected with the jump ends SW1 to SW4 respectively. Each smart power stage SPS further comprises an auxiliary power supply pin VCC, a signal ground pin AGND, a pulse width modulation pin PWMx, a current detection pin ISENSEX and a temperature detection pin TMON, wherein x is a natural number of 1 to 4 and is respectively in one-to-one correspondence with the four SPSs 1 to SPS4. In the same VR Cell, four SPS auxiliary power supply pins VCC of the four SPSs are shorted together, and an auxiliary power supply pin VCC of the VR Cell is further formed; the four SPSs signal ground pins AGND of the four SPSs are shorted together, and a signal ground pin AGND of the VR Cell is further formed; the four SPSs temperature detection pins TMON of the four SPSs are shorted together, and a temperature detection end TMON of the VR Cell is further formed for outputting a temperature detection signal of the SPS with the highest temperature in the four SPSs. The pulse width modulation pin PWMx further forms four pulse width modulation pins PWM1 to PWM4 in the VR Cell, receives a pulse width modulation signal and is used for controlling the turn-on and turn-off time of the switch of the half-bridge arm switch in the corresponding SPS, wherein PWM 1 to PWM 4 are sequentially staggered by 90 degrees. the four SPSs current detection pins IsenseX further include four current detection pins Isense1 to Isense4 of the VR Cell, and are used for outputting the internal detection current of each SPS.

Four inductors L1 to L4 are coupled to the same magnetic core to form a four-phase anti-coupling inductor Lcp; at least one section of common magnetic circuit is arranged on the magnetic core for the four-phase coupling inductor Lcp for closing magnetic lines of magnetic lines of the four inductors L1 to L4, and direct-current magnetic flux of the inductors L1 to L4 is superposed on the common magnetic circuit. And the pulse width modulation signals PWM1 to PWM4 in the same VR Cell are sequentially staggered by 90 degrees, so that the inductors L1 to L4 of the VR Cell have the characteristics of a large steady-state inductor and a small dynamic inductor. When the duty cycle D of the pulse width modulation signals PWM1 to PWM4 is closer to 25%, the larger the ratio of the steady-state inductance and the dynamic inductance of each inductor is, the more optimized the steady-state characteristic and the dynamic characteristic of the VR Cell have. the duty ratio of the traditional Buck circuit and the pulse width modulation signal are in the range from 10% to 90%. In order to obtain better steady-state characteristics and dynamic characteristics, the duty ratio D of the four pulse width modulation signals PWM1 to PWM4 is controlled to work within the range of 15%-35%; and furthermore, the duty ratio D can work within the range of 20%-30%. The means for specifically implementing the duty cycle comprises: 1) setting an output voltage amplitude of a power supply preceding stage of a VR Cell according to a VR Cell output voltage amplitude; or 2) applying a Buck converter circuit topology comprising a flying capacitor for an application determined by a VR Cell input voltage amplitude or an output voltage amplitude.

Figure 2A:
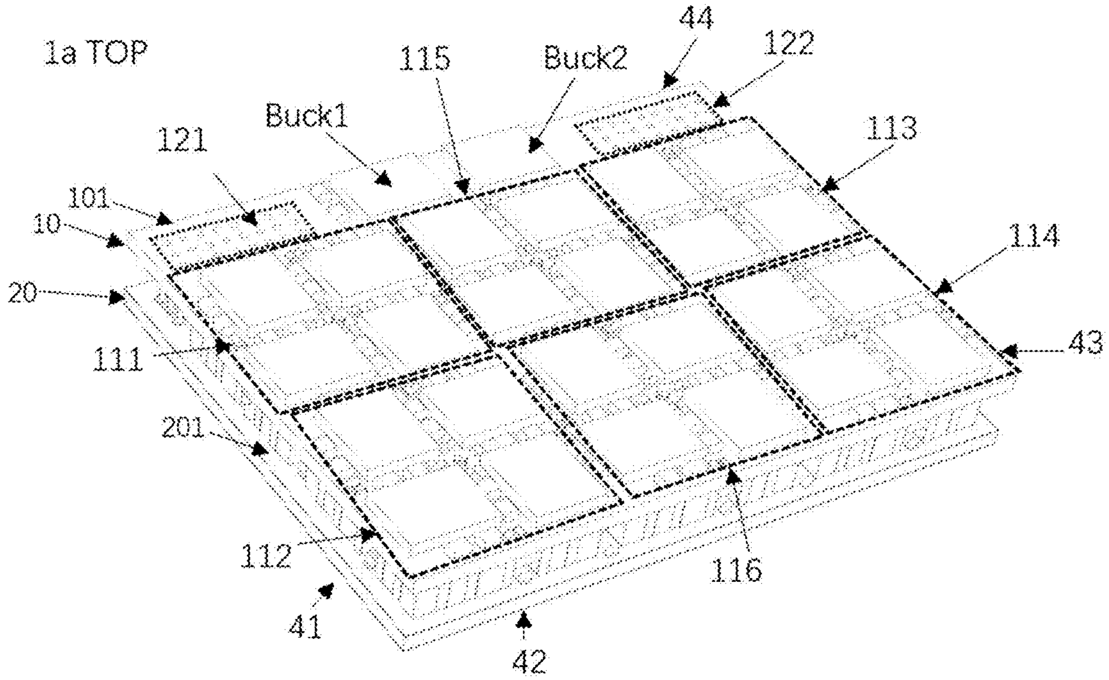
FIG. 2A is atop three-dimensional structure diagram of a high-performance power supply module 1*a*.
Figure 2B:
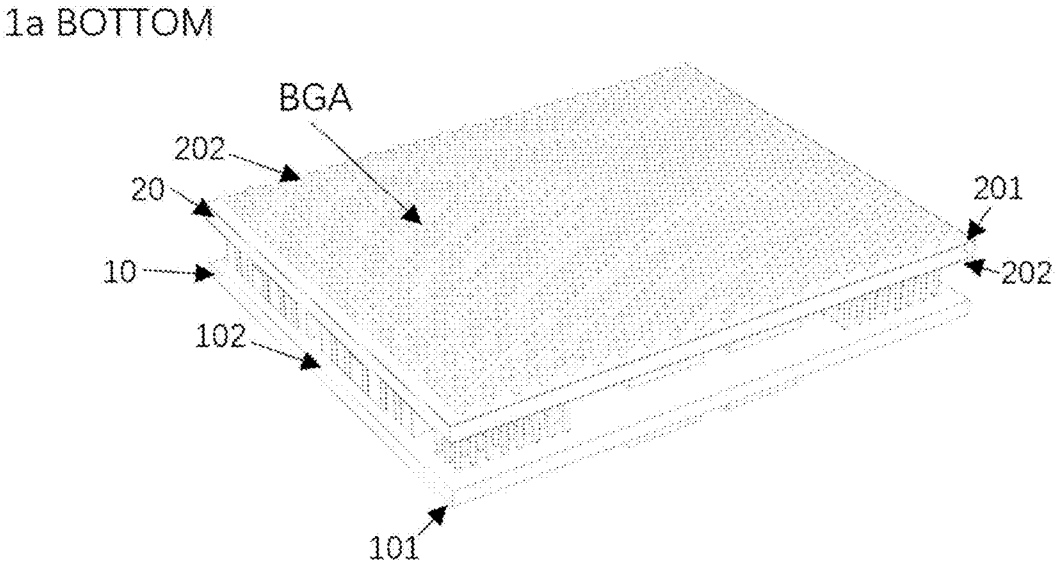
FIG. 2B is a bottom three-dimensional structure diagram of a high-performance power supply module 1*a*.

FIG. 2A and FIG. 2B are three-dimensional structure diagrams of the high-performance power supply module 1*a*, FIG. 2A is a three-dimensional structure diagram of the TOP surface of the high-performance power supply module 1*a*, and FIG. 2B is a three-dimensional structure diagram of the BOTTOM surface of the high-performance power supply module 1*a*. The high-performance power supply module 1*a* disclosed by the application adopts a voltage regulating unit comprising connecting a multi-phase voltage reduction circuit in parallel as shown in FIGS. 1A and 1B.

Meanwhile, referring to FIG. 1A and FIG. 1B, the high-performance power supply module 1*a* further comprises a first substrate 10 and a second substrate 20, the first substrate 10 comprises a first surface 101 and a second surface 102 opposite to each other, the second substrate 20 comprises a first surface 201 and a second surface 202 opposite to each other, and the first surface 101 is also referred to as a top surface 101; the second surface 102 is also referred to as a bottom surface 102; similarly, the first surface 201 is also referred to as a top surface 201; the second surface 202 is also referred to as a bottom surface 202. The high-performance power supply module 1*a*; and the high-performance power supply module 1*a* further comprises a first side surface 41, a second side surface 42, a third side surface 43 and a fourth side surface 44.

Each voltage regulating unit VR Cell comprises an SPS combination. With reference to FIG. 1B and FIG. 2A, the VR Cell 1 to the VR Cell 6 respectively comprise six SPS combinations 111, 112, 113, 114, 115 and 116, the six SPS combinations, the single-phase voltage reduction units Buck 1 and Buck 2 and the input capacitor Cin are arranged on the first surface 101 of the first substrate 10. The SPS combination 111 and the SPS combination 112 are arranged adjacent to the first side surface 41, the SPS combination 113 and the SPS combination 114 are arranged adjacent to the third side surface 43, the SPS combination 112, 116 and 114 are sequentially arranged adjacent to the second side surface 42, that is, the SPS combination 116 is arranged between the SPS combination 112 and the SPS combination 114, and the SPS combination 111, 115 and 113 are sequentially arranged adjacent to the fourth side surface 44, that is, the SPS combination 115 is arranged between the SPS combination 111 and the SPS combination 113. The first substrate 10 further includes connection holes 121 and 122, the connection holes 121 are disposed adjacent to the first side surface 41 and the fourth side surface 44, and the connection hole 122 is disposed adjacent to the third side surface 43 and the fourth side surface 44. The single-phase Buck units Buck 1 and Buck 2 are disposed adjacent to the fourth side surface 44 and are disposed between the connection holes 121 and 122. Referring to FIG. 2B, a ball grid array package (BGA) is arranged on a second surface 202 of a second substrate 20 and is used as a pin of a VR Cell or a high-performance power supply module. The pins comprise an input positive pin Vin+, an output positive pin Vo+, a grounding pin GND, an auxiliary power supply pin VCC, a signal ground pin AGND, a pulse width modulation pin PWMx, a current detection pin ISENSEX and a temperature detection pin TMON. When the high-performance power supply module is fixedly electrically connected with the system board, the pins are used for transmitting power or signals.

Figure 2C:
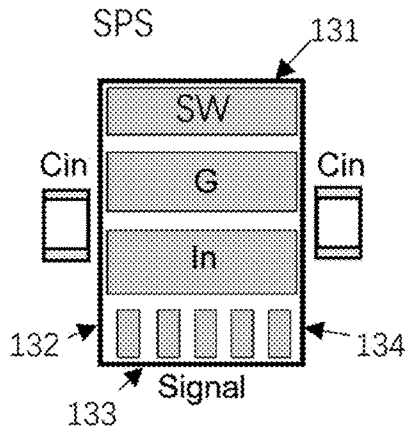
FIG. 2C is a Pin-map of an smart power stage SPS and the setting of a related external capacitor.

FIG. 2C shows a Pin-map of an smart power stage SPS and a positional relationship between same and a related input capacitor Cin; the Pin-map of the SPS comprises a first edge 131, a second edge 132, a third edge 133, and a fourth edge 134; the first edge 131 is opposite to the third edge 133, and the second edge 132 is opposite to the fourth edge 134. the SPS Pin-map further comprises a voltage-jump pin SW, a grounding pin G, an input pin IN and a signal pin SIGNAL, the voltage-jump pin SW is arranged on a first edge 131 of the SPS Pin-map, the signal pin SIGNAL is arranged on a third edge 113 of the SPS Pin-map, and the voltage-jump pin SW, the grounding pin G, the input pin IN and the signal pin SIGNAL are sequentially arranged from the first edge 131 to the third edge 133. When SPS is applied to the VR Cell or the power supply module, the input capacitor Cin is adjacent to and is close to the second edge 132 and the fourth edge 134, that is, the input capacitor Cin is arranged adjacent to the grounding pin G and the input pin IN; and the loop formed by the input capacitor Cin and the SPS inner half-bridge arm is minimum. In the smart power stage SPS, the voltage-jump pin SW is the jump end SWx of the SPS in the VR Cell, the grounding pin G is the grounding end GND1 of the SPS in the VR Cell, and the input pin IN is the input positive end Vin+1 of the SPS in the VR Cell.

Figure 2D:
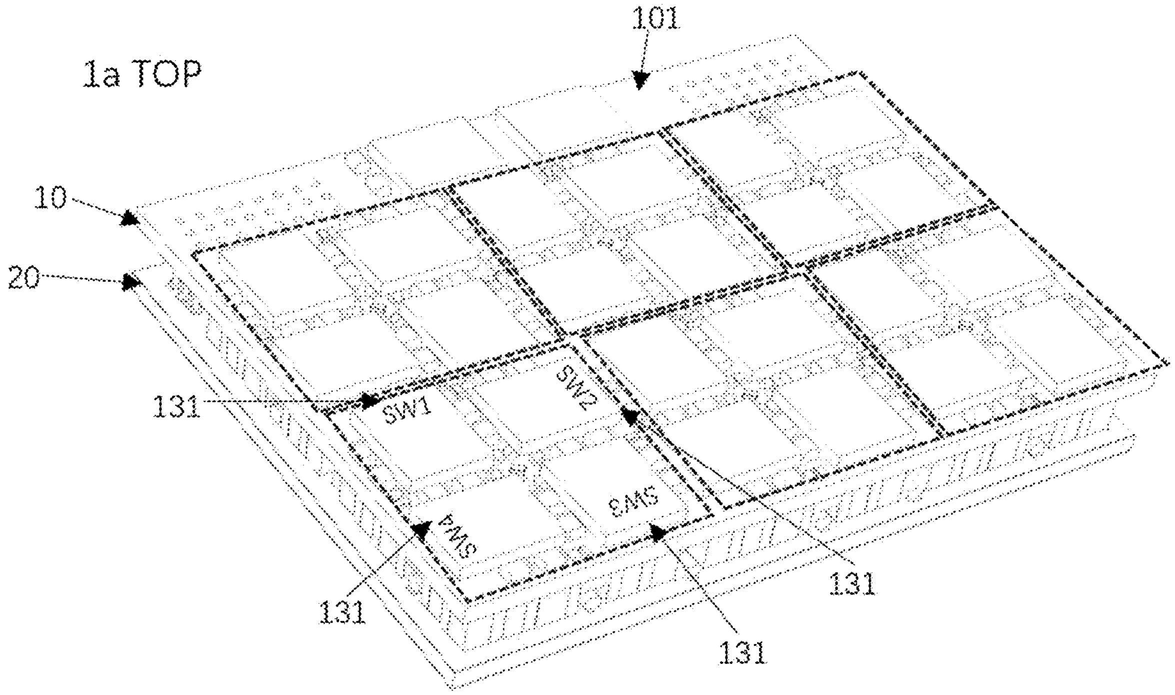
FIG. 2D is an internal layout of an SPS combination.

FIG. 2D discloses the internal layout of each SPS combination on the first surface 101 of the first substrate 10, the layout inside the SPS combination 111 to 116 is basically the same, and the SPS combination 112 is taken as an example. The SPS combination 112 comprises four SPS, which respectively correspond to SPS1 to SPS4; the voltage-jump pins of the SPS1 to the SPS4 are respectively the SW1 to SW4, and each SPS of SW1 to SW4 shown in FIG. 2D is adjacent to the first edge 131 of the SPS in the SPS combination 112, the four SPSs are arranged in a four-blade windmill shape, and each SPS is one blade of the windmill. Each SPS is vertically arranged with an adjacent SPS, for example, the SPS1 is perpendicular to the SPS2 and is perpendicular to the SPS4. The input capacitor Cin is simultaneously adjacent to the second side 132 and the fourth side 134 of each SPS, so that the input capacitor and the half-bridge arm form a minimum loop. The voltage-jump pins SW of each SPS are located at the top ends of the blades; and in the same VR Cell, the voltage-jump pins SW1, SW2, SW3 and SW4 are sequentially arranged in the clockwise direction.

Figure 3A:
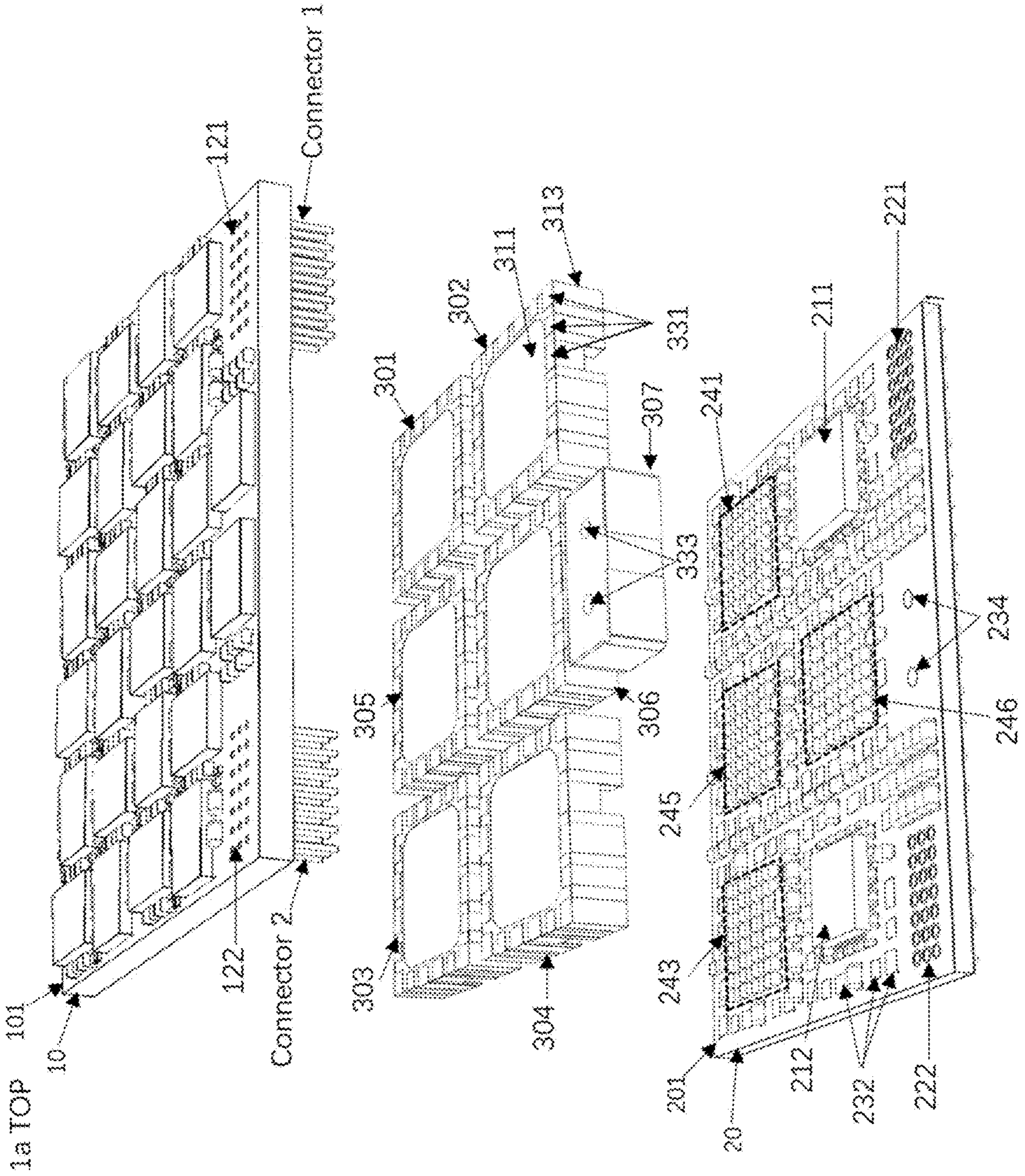
FIG. 3A is a schematic exploded view of a TOP surface three-dimensional structure of a high-performance power supply module 1*a*.
Figure 3B:
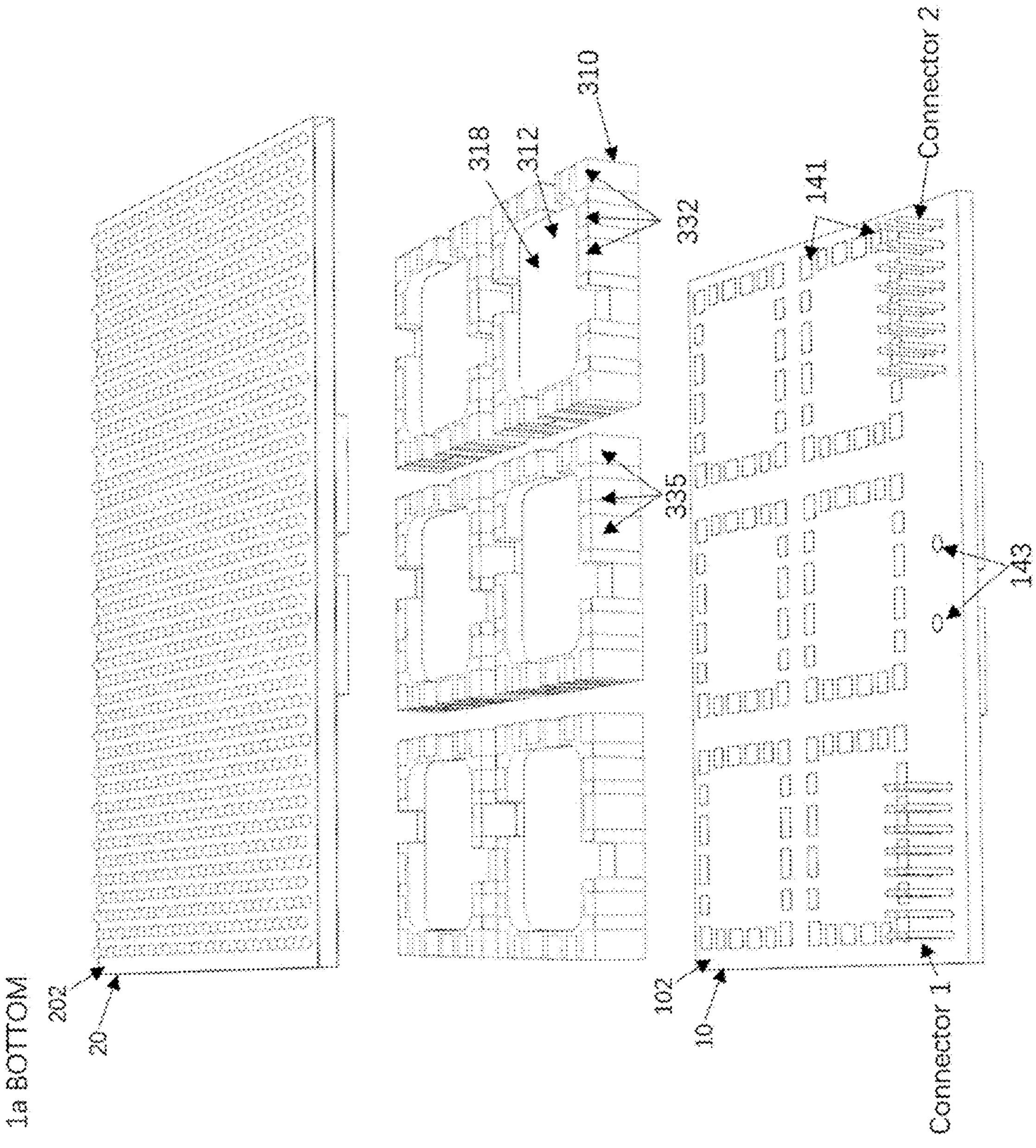
FIG. 3B is a schematic exploded view of a bottom surface three-dimensional structure of a high-performance power supply module 1*a*.

Referring to the top surface and the bottom surface of the high-performance power supply module 1*a* shown in FIGS. 3A and 3B, the high-performance power supply module 1*a* further comprises six four-phase anti-coupling inductors 301/302/303/304/305/306, a two-phase inductor 307, an output capacitor Co, a connector 1, a connector 2 and a controller 211/212.

The six four-phase anti-coupling inductors 301/302/303/304/305/306 and the two-phase inductor 307 are both arranged between the first substrate 10 and the second substrate 20; furthermore, the six four-phase anti-coupling inductors 301/302/303/304/305/306 and the two-phase inductor 307 are both arranged between the second surface 102 of the first substrate 10 and the first surface 201 of the second substrate 20. The six four-phase coupling inductors 301/302/303/304/305/306 are fixed and electrically connected with the bonding pads 141 on the second surface 102 of the first substrate 10 through the top surface bonding pads 331, and are fixed and electrically connected with the bonding pads 232 on the first surface 201 of the second substrate 20 through the bottom surface bonding pads 332. Six four-phase coupling inductors 301/302/303/304/305/306 are respectively connected with the six SPS combinations 111, 112, 113, 114, 115 and 116 in a one-to-one correspondence mode to form six VR Cells shown in FIG. 1A. The two-phase inductor 307 is fixed and electrically connected to the bonding pad 143 on the second surface 102 of the first substrate 10 by means of the top surface bonding pad 333, and is fixed and electrically connected to the bonding pad 234 on the first surface 201 of the second substrate 20 by means of the bottom surface bonding pad 334 (not shown). The bonding pad 234 is equivalent to an output positive end of the single-phase voltage reduction unit Buck 1 and Buck 2.

The second substrate 20 comprises connecting holes 221 and 222, and the connecting holes 221 are arranged adjacent to the first side surface 41 and the fourth side surface 44 of the high-performance power supply module 1*a*; and the connecting holes 222 are arranged adjacent to the third side surface 43 and the fourth side surface 44 of the high-performance power supply module 1*a*. Two ends of the connector 1 are respectively inserted into the connecting holes 121 and 221, two ends of the connector 2 respectively penetrate into the connecting holes 122 and 222, and are fixed and electrically connected by welding; the first substrate 10 and the second substrate 20 realize a plurality of power and a plurality of signal transmission by means of the Connector 1 and the Connector 2; and pins or conductors in the Connector 1 and the Connector 2 are signal electrical connectors between the first substrate 10 and the second substrate 20. Furthermore, the connecting holes 121/122 on the first substrate 10 are through holes to provide mechanical limiting for the Connector 1 and the Connector 2; and the connecting holes 221/222 on the second substrate 20 are blind holes, which can not only provide mechanical limiting for the Connector 1 and the Connector 2, but also prevent displacement between the first substrate 10 and the second substrate 20 in reflow soldering, without occupying the area of the second surface 202 of the second substrate 20, without affecting the number and arrangement area of the BGA. In other embodiments, the connecting hole 121/122/221/222 can also be replaced with a surface bonding pad; the Connector 1 and the Connector 2 are bonded on the side surfaces of the corresponding four-phase anti-coupling inductors through side surfaces to realize mechanical limiting; and the Connector 1 and the Connector 2 are welded and fixed with the corresponding bonding pads through two ends to realize electrical connection between the first substrate 10 and the second substrate 20, so that the position of the first surface 101 of the first substrate 10 provided with the connecting holes 121/122 can be used for arranging other surface mounted devices.

The controllers 211 and 212 are arranged on the first surface 201 of the second substrate 20 and are used for controlling the voltage stabilization output of at least four power supply paths in the first power supply path Rail 1 to the fifth power supply path Rail 5. The controllers 211 and 212 generate corresponding pulse width modulation PWMx by detecting the output voltage Vo+x of each power supply path and are used for controlling the corresponding voltage regulating unit VR Cell or the single-phase voltage reduction unit Buck. Compared with the fact that the controllers 211 and 212 are arranged outside the high-performance power supply module, the controllers 211 and 212 are arranged in the high-performance power supply module 1*a* and arranged on the second substrate 20, so that the function integration level of the high-performance power supply module 1*a* is greatly increased, and the second substrate 20 only needs to transmit signals related to the smart power stage SPS to the first substrate 10; and the number of signal electrical connectors between the first substrate 10 and the second substrate 20 is reduced for the application of less SPS number on the first substrate 10. In addition to being provided on the second substrate 20, the controllers 211 and 212 can also be provided on the first substrate 10. For applications with multiple SPS numbers on the first substrate 10, the controllers 211 and 212 are directly electrically connected to signals related to the smart power level SPS through the first substrate 10, which has the advantage of reducing the number of signal electrical connectors between the first substrate 10 and the second substrate 20.

The output capacitor Co is arranged on the first surface 201 of the second substrate 20 and is respectively bridged between the output positive end Vo+x and the grounding end GND. Part of the output capacitor Co respectively form a first capacitor assembly 241, a third capacitor assembly 243, a fifth capacitor assembly 245 and a sixth capacitor assembly 246; the first capacitor assembly 241, the third capacitor assembly 243, the fifth capacitor assembly 245, and the sixth capacitor assembly 246; and the controllers 121 and 122 are respectively located below the corresponding six four-phase coupling inductors, and are arranged directly opposite to each other.

Referring to FIG. 3B, the four-phase anti-coupling inductor further comprises a magnetic core assembly and an inductor frame 310, and the inductor frame 310 comprises a top surface bonding pad 331, a bottom surface bonding pad 332, and a side wall electrical connector 335. A height difference exists between the surface of a lower magnetic substrate 312 and the bottom surface bonding pad 332, and the bottom surface groove 318 is formed. After the high-performance power supply module 1*a* is assembled, the first capacitor assembly 241, the third capacitor assembly 243, the fifth capacitor assembly 2453, the sixth capacitor assembly 2464 and the controllers 121 and 122 are accommodated in the grooves 318 of the six four-phase coupling inductors respectively, so that the integration level of the high-performance power supply module 1*a* is improved, the loop parasitic parameters formed by the output capacitor Co and the output positive pin Vo+x and the grounding pin GND (equivalent to BGA arranged on the second surface 202 of the second substrate 20) of the corresponding power supply path are reduced, the power loss of the high-performance power supply module is reduced, and the dynamic response characteristic of the high-performance power supply module is improved.

Figure 4A:
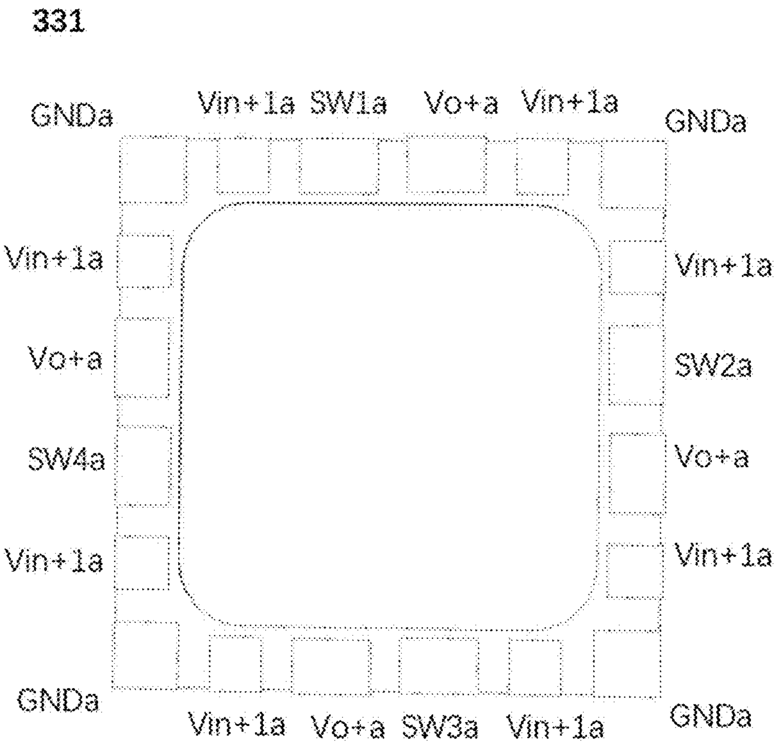
FIG. 4A is a pad layout of the top surface of a four-phase coupling inductor.
Figure 4B:
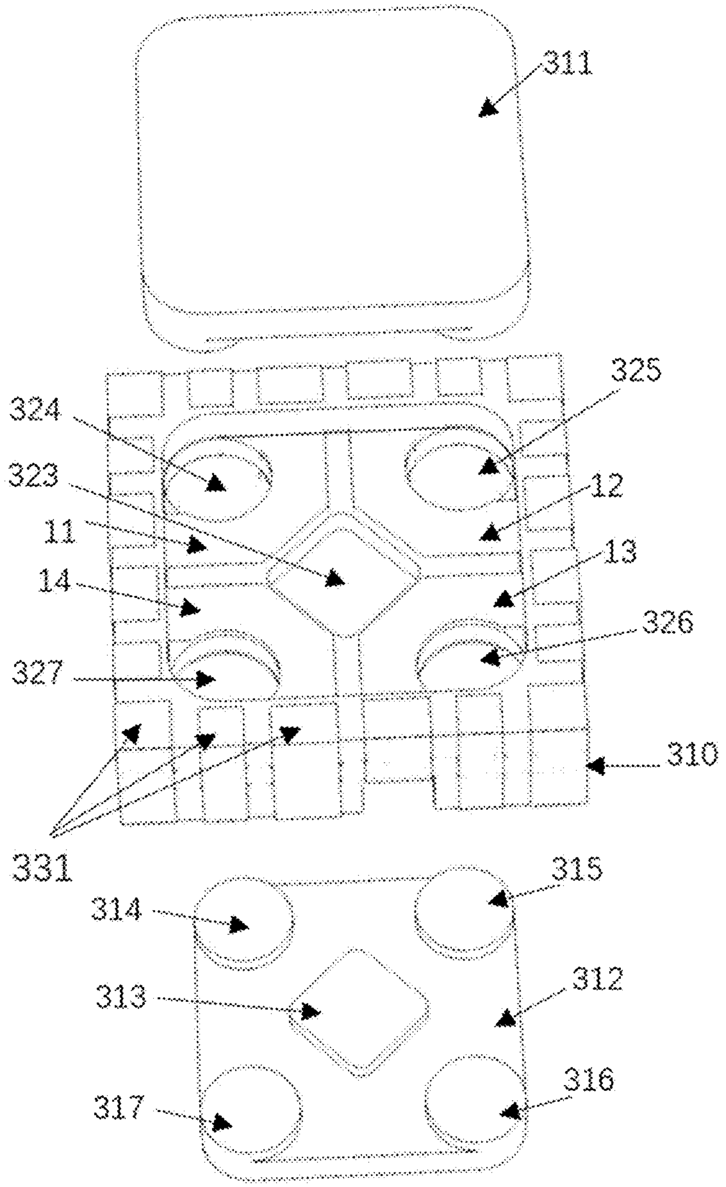
FIG. 4B is a three-dimensional exploded diagram of a four-phase anti-coupling inductor.
Figure 4C:
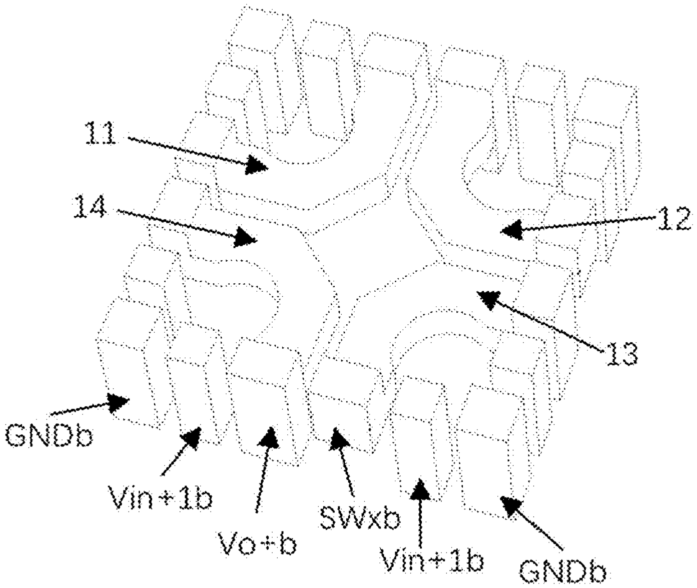
FIG. 4C is an internal structure diagram of an inductor frame.

FIG. 4A, FIG. 4B and FIG. 4C show detailed structures of a four-phase anti-coupling inductor. FIG. 4A is a layout of a four-phase coupling inductor top surface bonding pad 331. FIG. 4B is a exploded diagram of a four-phase anti-coupling inductor. FIG. 4C is an internal structure diagram of an inductor frame. Referring to FIG. 4C, the side electrical connector 335 comprises a grounding connector GNDb, an input positive connector Vin+1*b*, an output positive connector Vo+b and a jump connector SWxB to realize the conductive function with the first substrate or the second substrate. a grounding connector GNDb, an input positive connector Vin+1*b* and an output positive connector Vo+b. The corresponding top surface bonding pads of the top surface of the inductor frame 310 are respectively a grounding pad GNDa, an input positive pad Vin+1*a* and an output positive pad Vo+a; a grounding connector GNDb, an input positive connector Vin+1*b* and an output positive connector Vo+b. The corresponding bottom surface bonding pads of the bottom surface of the inductor frame 310 are respectively a grounding pad GNDc, an input positive pad Vin+1*c*, and an output positive pad Vo+c (not shown). The corresponding top surface pad on the top surface of the inductor frame 310 of the jump connector SWB is SWxA. A ground pad GNDa and an input positive pad Vin+1*a* are electrically connected to corresponding pins of an SPS provided on a first surface 101 of the first substrate 10 by means of a first substrate 10. a ground pad GNDa, an input positive pad Vin+1*a*, and an output positive pad Vo+a are electrically connected to a corresponding BGA provided on a second surface 202 of the second substrate 20 by means of a second substrate 20. The grounding connector GNDb and the input positive connector Vin+1*b* are respectively used for realizing electrical connection between the SPS on the first substrate 10 and the corresponding BGA on the second substrate 20.

In the top view of the four-phase coupling inductor shown in FIG. 4A, the outer frame of the inductor frame 310 is quadrilateral, and the top pad 331 is arranged along the four sides of the quadrangle respectively. Each edge of the quadrilateral comprises a jump pad SWxA (equivalent to SW1*a*, SW2*a*, SW3*a* and SW4*a*), the projection of each jump pad SWxA on the first surface 101 of the first substrate 10 is at least partially overlapped with the projection of the voltage-jump pin SW of the corresponding SPS on the first surface 101 of the first substrate 10, and the jump pad SWxA is electrically connected with the voltage-jump pin SW of the corresponding SPS through the first substrate. In this way, the short-circuit distance between the jump pad SWxA and the voltage-jump pin SW corresponding to the SPS is the shortest. Further, on each side of the top surface of the inductor frame 310, the top surface pad is sequentially arranged according to the sequence of the grounding pad GNDa, the input positive pad Vin+1*a*, the output positive pad Vo+A, the jump pad SWxA, the input positive pad Vin+1*a* and the grounding pad GNDa. On each side of the bottom surface of the inductor frame 310, the bottom surface bonding pad is sequentially arranged according to the sequence of a grounding pad GNDc, an input positive pad Vin+1*c*, an output positive pad Vo+c, an input positive pad Vin+1*c* and a ground pad GNDc (not shown); in other embodiments, the top surface pad 331 can also not comprise an output positive pad Vo+a.

As shown in FIG. 4B, the magnetic core assembly comprises an upper magnetic substrate 311, a lower magnetic substrate 312, a middle column 313 and four side columns 314/315/316/317, and the four side columns 314/315/316/317 are arranged around the middle column 313. The inductor frame 310 further comprises holes 323/324/325/326/327, and the middle column 313 and the four side columns 314/315/316/317 respectively pass through the corresponding holes 323/324/325/326/327 in a one-to-one correspondence manner; the upper magnetic substrate 311 is buckled from the top surface of the inductor frame 310 and the lower magnetic substrate 312 from the bottom surface of the inductor frame 310. The inductor frame 310 further comprises an inductor winding 11/12/13/14, the four inductor windings have the same structure, one end (equivalent to the jump end SWx) of each inductor winding is connected with the corresponding jump connection piece SWB, and the other end (equivalent to the output positive end Vo+) is electrically connected with the corresponding output positive connection piece Vo+b. The four inductor windings arrive at the output positive end Vo+ in the same direction from the jump end SWx, that is, in the same clockwise direction or the same anticlockwise direction, the same direction in the embodiment is the clockwise direction. The jump end SWx and the output positive end Vo+ of each inductor winding are located on two adjacent side edges of the inductance frame, the jump end SWx of each inductor winding is adjacent to the output positive end Vo+ of the previous inductor winding, and the output positive end Vo+ of each inductor winding is adjacent to the jump end SWx of the next inductor winding; and the four inductor windings are adjacent in pairs. a grounding connector GNDb and two input positive connectors Vin+1*b* are arranged between the jumping end SWx and the output positive end Vo+ of each inductor winding, and the two input positive connectors Vin+1*b* are located on the two sides of the grounding connector GNDb, so that the loop parasitic inductance comprising the input positive connector Vin+1*b* and the grounding connector GNDb is minimum. The inductor assembly 301 further comprises an insulating material, and the side electrical connector 335 and the inductive winding 11/12/13/14 by means of plastic packaging or pressing. The voltages of the two ends of the four inductor windings are staggered by 90 degree.

The high-performance power supply module disclosed by the application can also only comprise one voltage regulation unit VR Cell, the layout of the SPS in the VR Cell, the structure of the four-phase coupling inductor and the arrangement of the output capacitor have the technical features and advantages of the embodiment, and details are not described herein again.

Embodiment 2

Figure 5A:
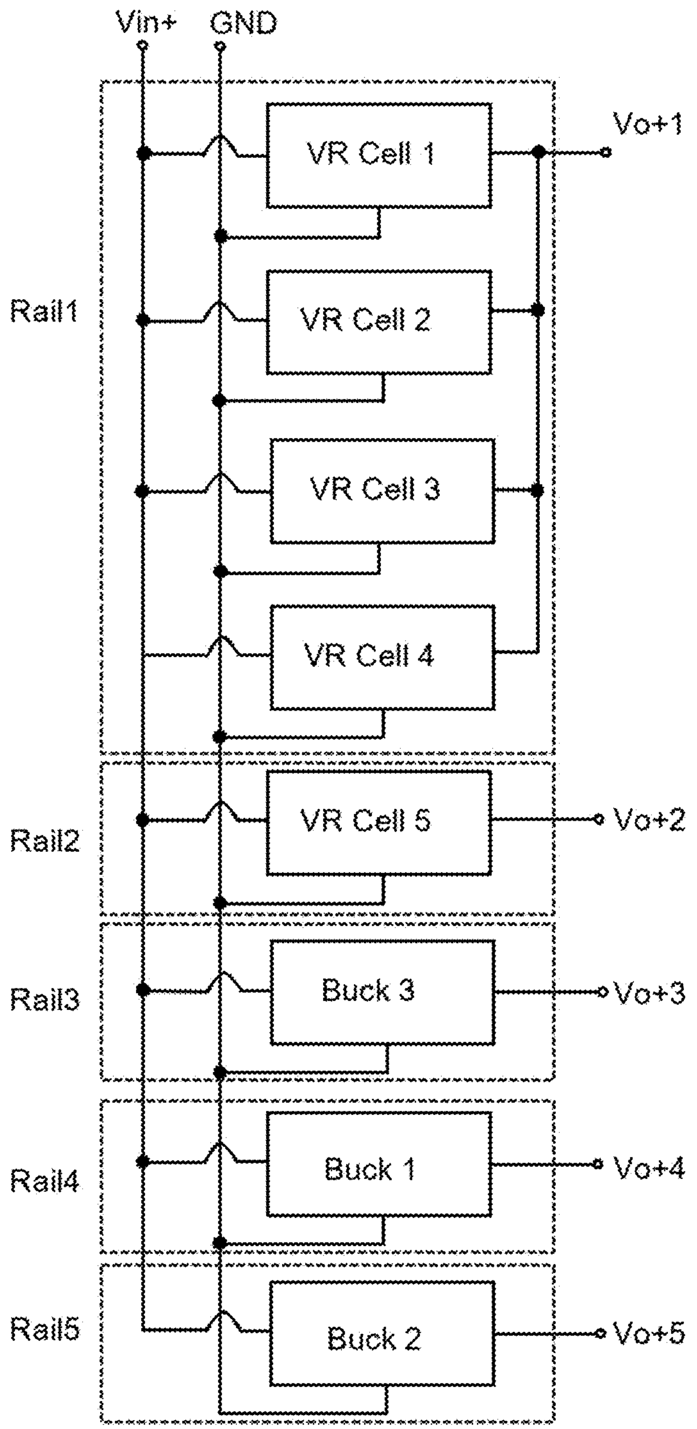
FIG. 5A is a circuit block diagram of a power supply module comprising another plurality of voltage regulating units.
Figure 5B:
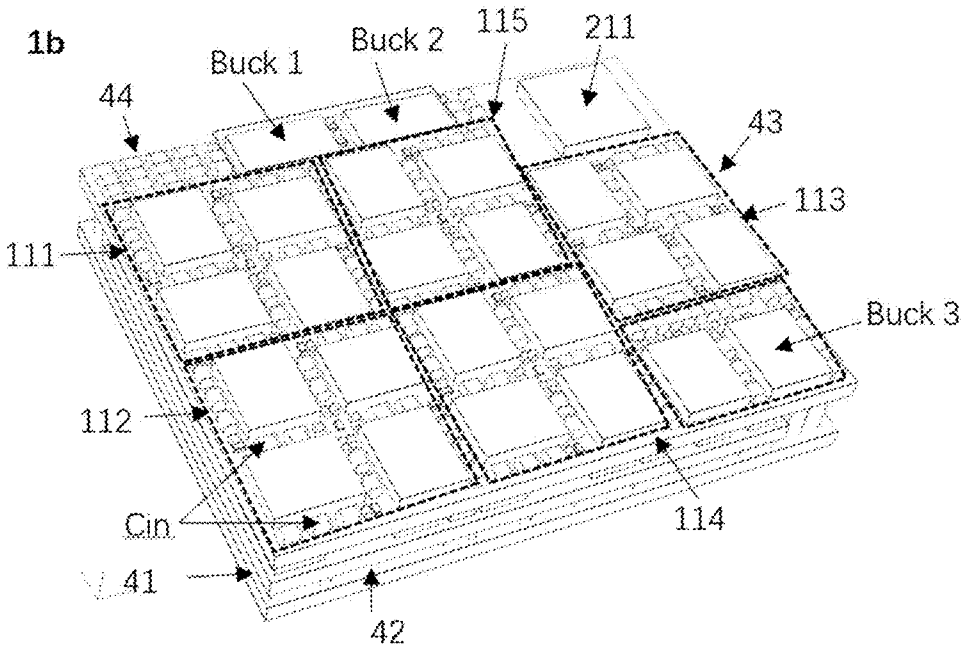
FIG. 5B is atop three-dimensional structure diagram of a high-performance power supply module 1*b*.
Figure 5C:
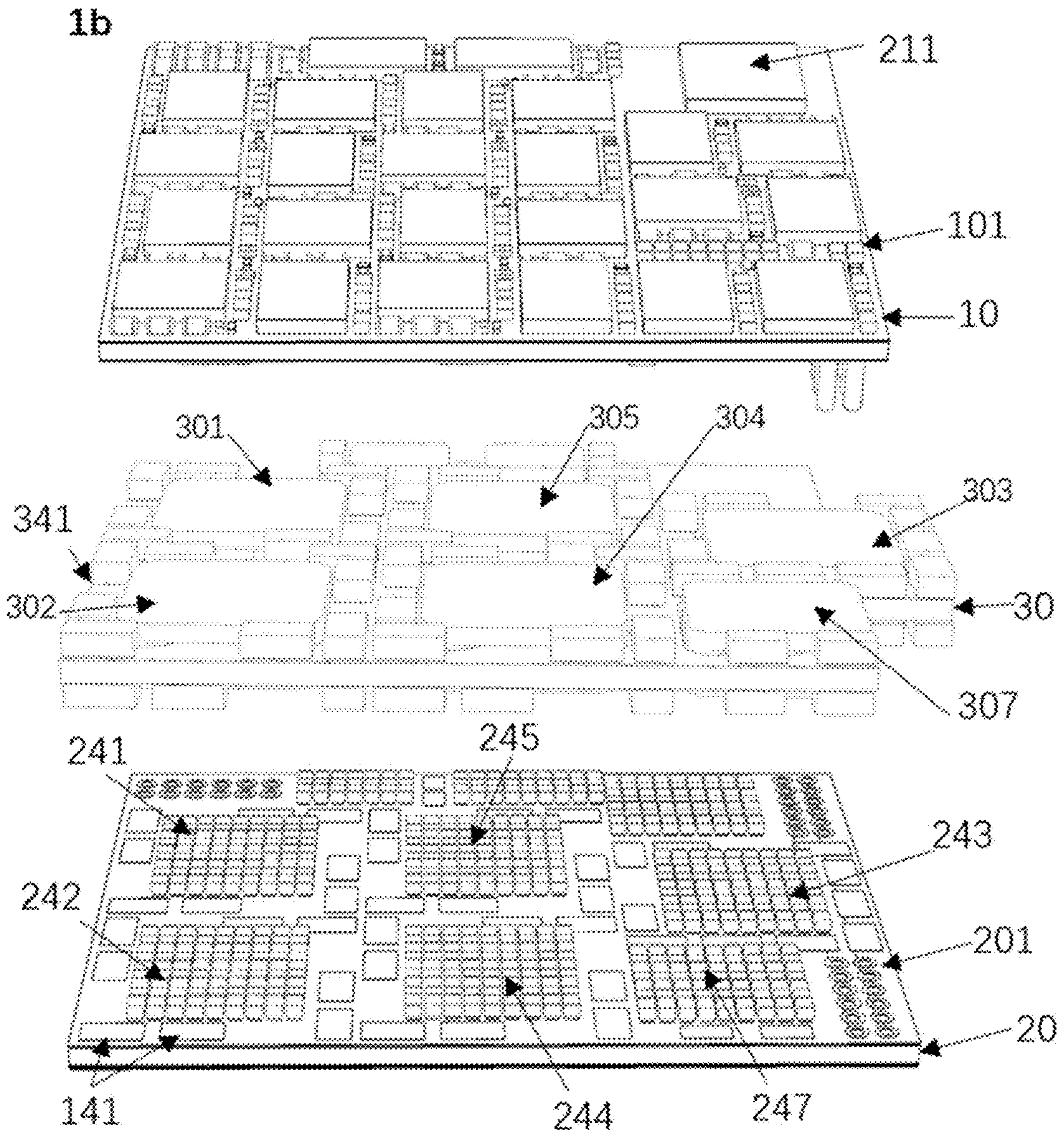
FIG. 5C is a schematic exploded view of a top surface three-dimensional structure of a high-performance power supply module 1*b*.

As shown in FIG. 5A, a circuit block diagram of a power supply module composed of a plurality of voltage regulating units. The difference between this embodiment and the circuit block diagram of the power supply module shown in FIG. 1B in that the voltage regulating unit VR Cell 6 is replaced by a two-phase parallel voltage reduction circuit Buck 3. The embodiment of the application discloses a structural layout of a high-performance power supply module 1*b* applying the circuit block diagram shown in FIG. 5A. FIG. 5B is a three-dimensional structure diagram of the TOP surface of the high-performance power supply module 1*b*. FIG. 5C is a three-dimensional decomposition schematic diagram of the high-performance power supply module 1*b*.

The high-performance power supply module 1*b* includes a first substrate 10, a second substrate 20, and a third substrate 30, wherein the third substrate 30 is disposed between the first substrate 10 and the second substrate 20. The first substrate 10 comprises a first face 101 and a second surface 102 opposite to each other, and the high-performance power supply module 1*b* further comprises a first side face 41, a second side face 42, a third side face 43 and a fourth side face 44, wherein the first side face 41 and the third side face 43 are opposite to each other, and the second side face 42 is opposite to the fourth side face 44. In combination with FIG. 5B and FIG. 2A, the layout on the first surface 101 is different in that the position originally provided with the SPS combination 116 is used for setting the SPS combination 114, and the position originally provided with the SPS combination 114 is used for setting two smart power stages of the two-phase parallel voltage reduction circuit Buck 3. Correspondingly, the position of originally provided with the voltage regulation unit VR Cell 4 is arranged at the position originally provided with the voltage regulation unit VR Cell 6, and the position, originally provided with the voltage regulation unit VR Cell 4, is used for setting the two-phase parallel voltage reduction circuit Buck 3. The controller 211 is arranged on the first surface 101 of the first substrate 10. The input capacitor Cin is adjacent to and is close to the second edge 132 and the fourth edge 134 of each SPS, the setting principle is the same as that of the first embodiment, and details are not described herein again.

The second substrate 20 comprises a first surface 201 and a second surface 202 which are opposite to each other, wherein the first surface 201 and the second surface 202 are the same as the first embodiment, and the output capacitor Co is arranged on the first surface 201 of the second substrate and is respectively bridged between the output positive end Vo+x and the grounding end GND. Part of the output capacitor Co are divided into a first output capacitor assembly 241, a second output capacitor assembly 242, a third output capacitor assembly 243, a fourth output capacitor assembly 244, a fifth output capacitor assembly 245 and a seventh output capacitor assembly 247, and the output capacitor assemblies 241/242/243/244/245/247 are respectively located under the two-phase inductors 307 of the Buck 3 and under the five four-phase coupling inductors 301/302/303/304/305 and the two-phase parallel voltage reduction circuit Buck 3. The pads 141 are disposed around the output capacitor assembly 241/242/243/244/245/247, respectively.

Figure 5D:
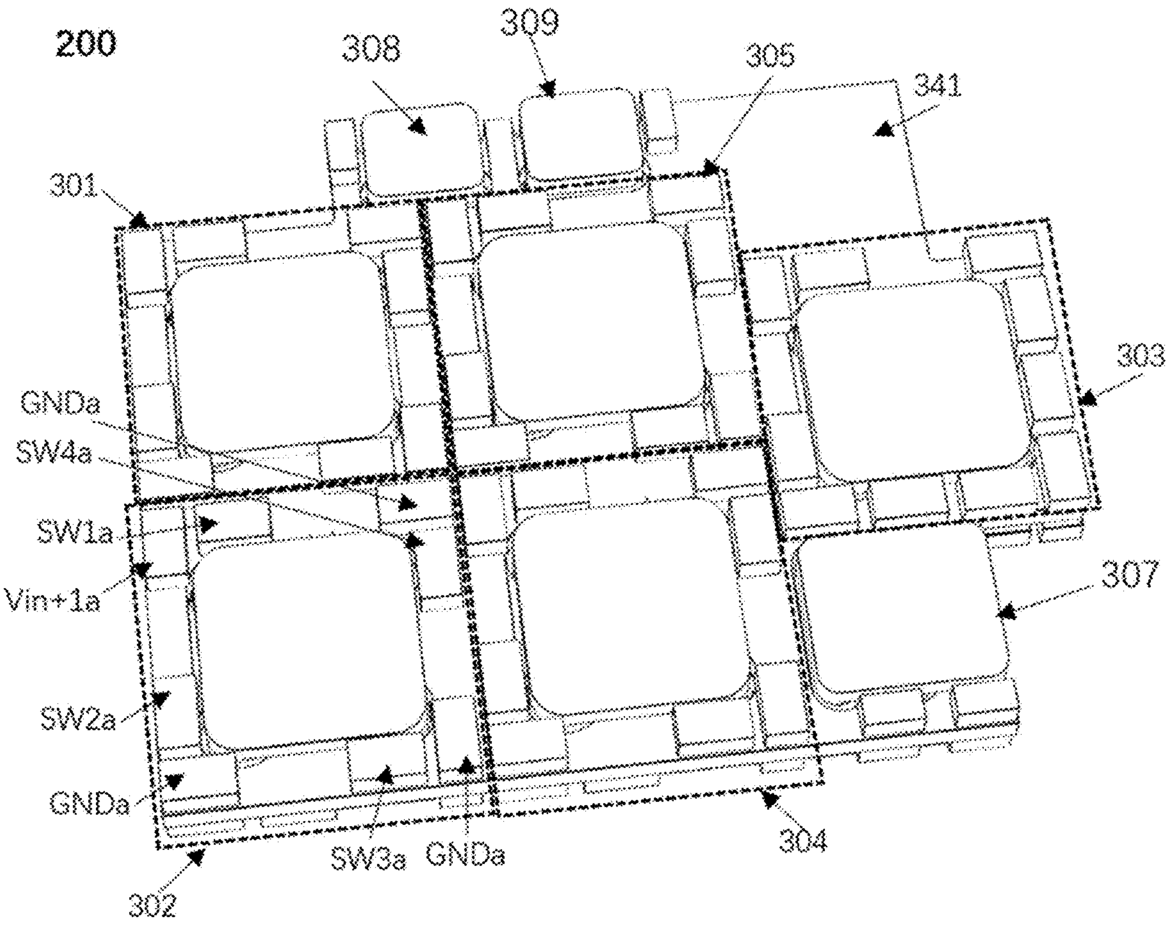
FIG. 5D is a top three-dimensional structure diagram of a magnetic assembly 200.
Figure 5E:
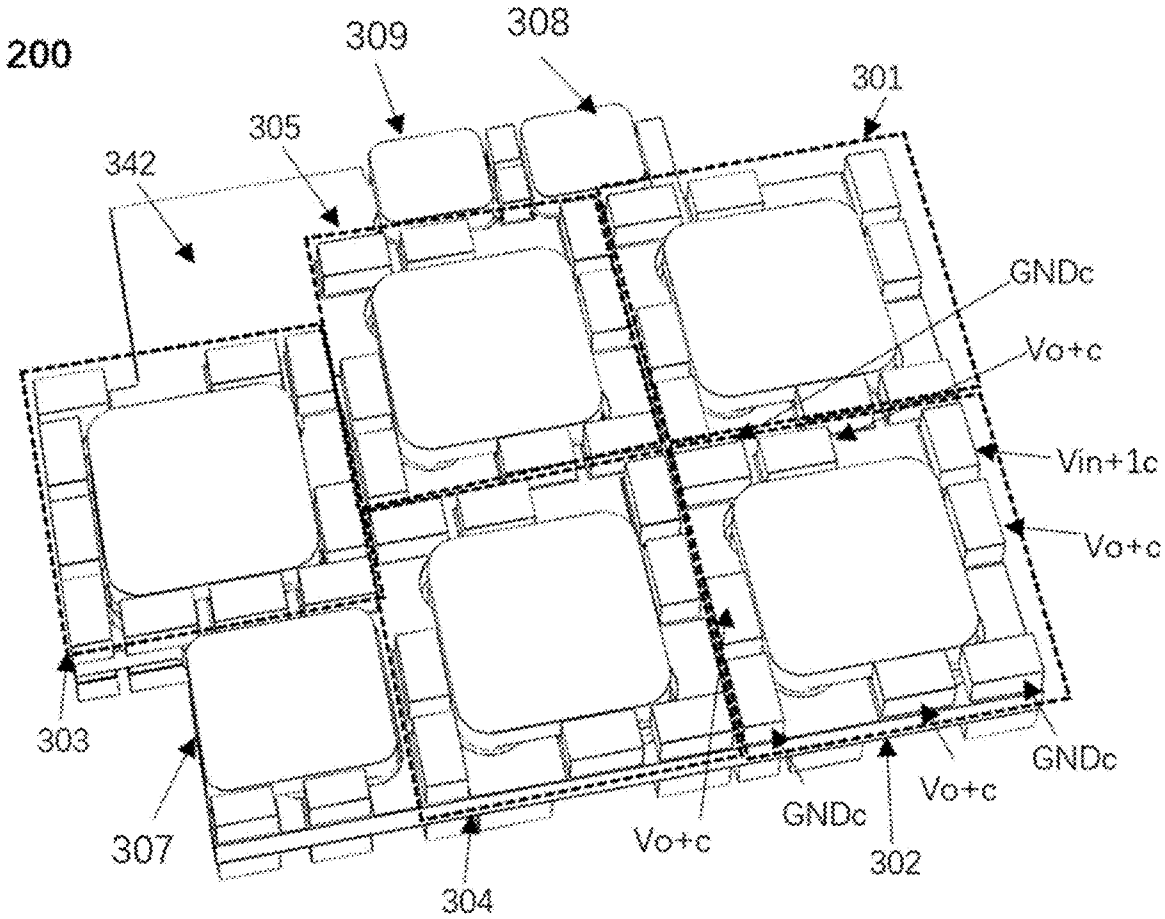
FIG. 5E is a bottom three-dimensional structure diagram of a magnetic assembly 200.
Figure 5F:
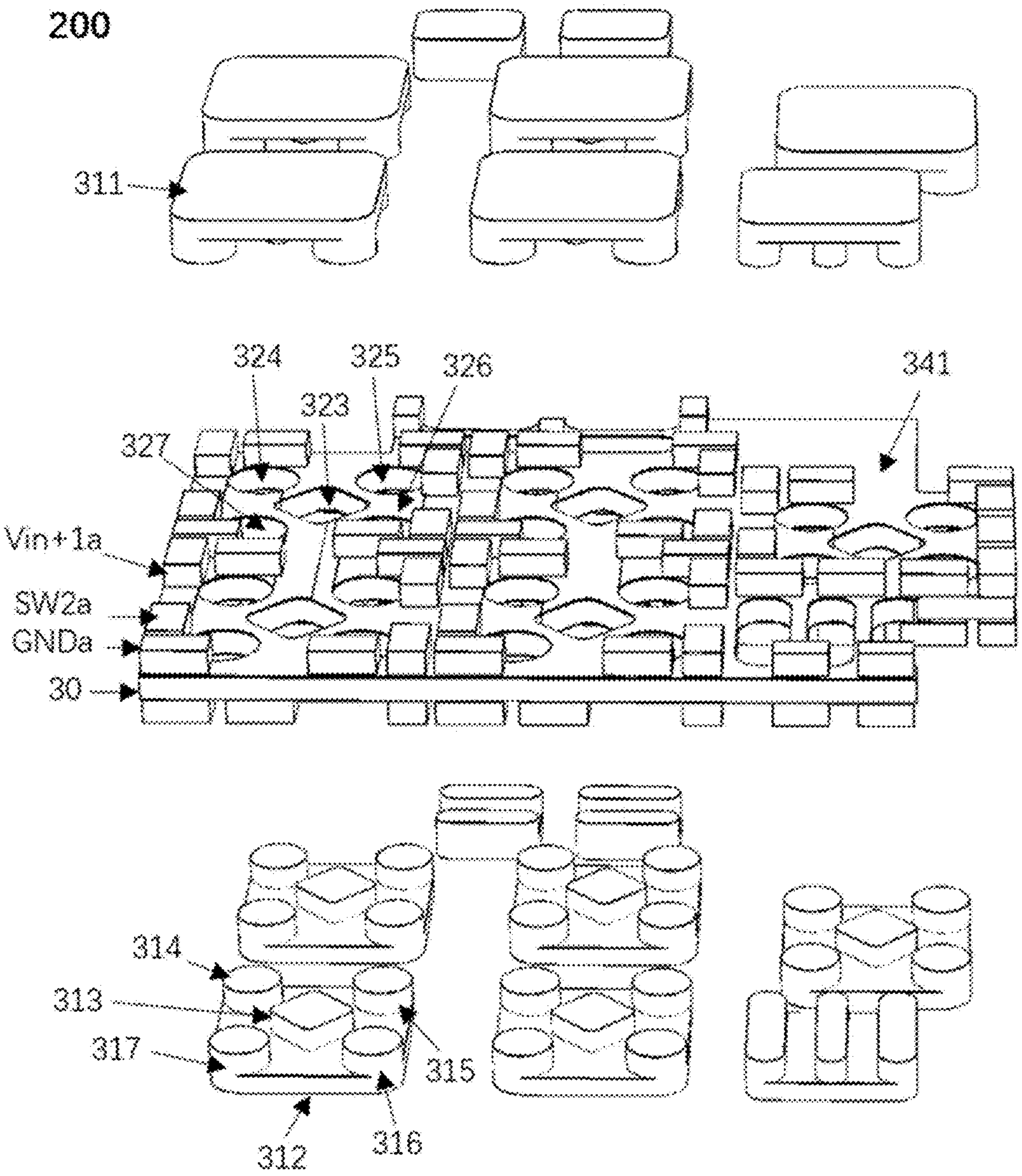
FIG. 5F is a schematic exploded view of a top surface three-dimensional structure of a magnetic assembly 200.
Figure 5G:
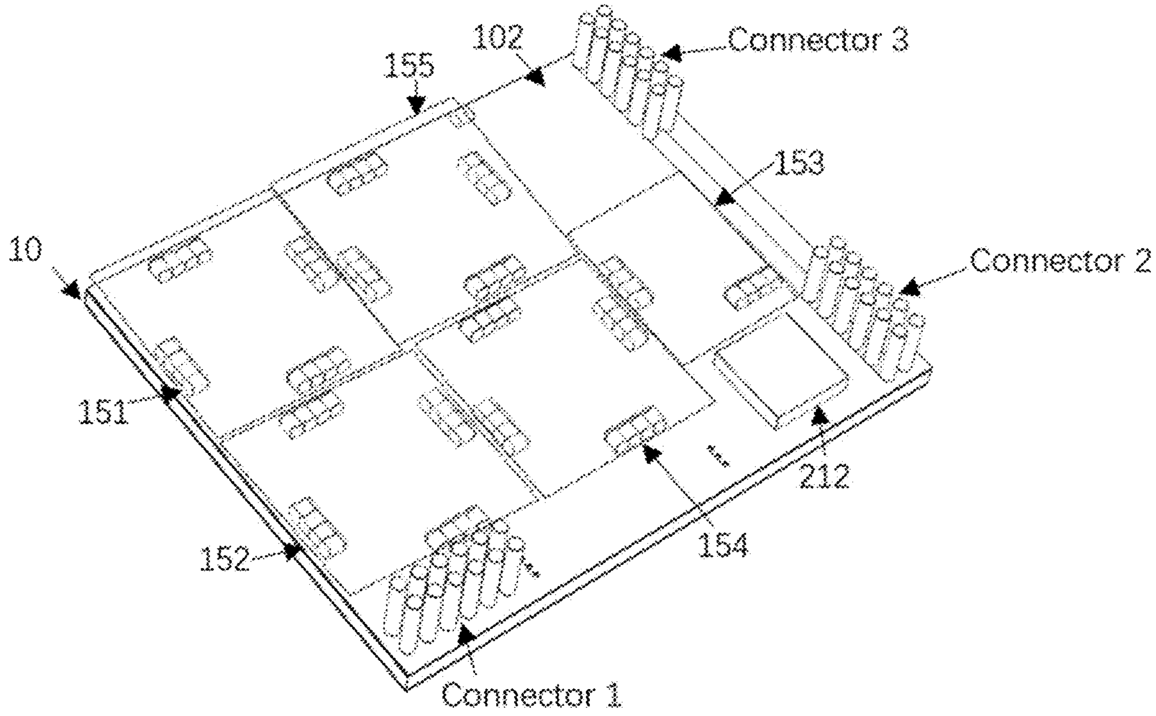
FIG. 5G is a schematic layout diagram of a second surface of the first substrate.

FIG. 5D is a top view of the magnetic assembly 200. FIG. 5E is a bottom view of the magnetic assembly 200. FIG. 5F is a top exploded view of the magnetic assembly. FIG. 5G is a bottom view of the first substrate 10. As shown in FIG. 5D to FIG. 5F, the magnetic assembly 200 comprises five four-phase anti-coupling inductors 301/302/303/304/305, a two-phase inductor 307 and two single-phase inductors 308/309; the five four-phase inductance 307/302/303/304/305 are respectively located under the SPS combination in the VR Cell 1 to the VR Cell 5; one two-phase inductor 307 is located under the two SPS in the two-phase parallel voltage reduction circuit Buck 3, or the positions of the two are at least partially overlapped up and down; and the two single-phase inductors 308/309 are respectively located under the two single-phase voltage reduction units Buck 1 and Buck 2 or at least partially overlapped up and down. The magnetic assembly 200 further comprises a third substrate 30, and the third substrate 30 comprises a first surface 341 and a second surface 342 opposite to each other, and a built-in inductive winding and a hole. Taking the holes 323/324/325/326/327 of the four-phase coupling inductor 301 as an example, the holes 323/324/325/326/327 allow the middle column 313 and the side columns 314/315/316/317 to pass through, and the upper magnetic substrate 311 and the lower magnetic substrate 312 are respectively buckled with the middle column and the four side columns from the first surface 341 and the second surface 342. Four inductor windings arranged in the third substrate 30 surround the four side columns 314/315/316/317 respectively, and the shape of the inductor winding is as shown in FIG. 4C. In addition, the structure of the two-phase inductor 307 and the single-phase inductor 308/309 is similar to the structure of the four-phase anti-coupling inductor in the embodiment, and details are not described herein again.

The magnetic assembly 200 further comprises a grounding connector GNDb, an input positive connector Vin+1*b*, and a jump connector SWB disposed on the first surface 341 of the third substrate 30. The connectors are used for realizing electrical connection with the first substrate. Referring to FIG. 5D, the four-phase coupling inductor 302 is taken as an example for description, the connector comprises four jumping connectors SW1*b*/SW2*b*/SW3*b*/SW4*b*, the three grounding connectors GNDb and one input positive connector Vin+1*b* are arranged around the upper magnetic substrate 311 and are divided into four groups; and a group of SW1*b* and Vin+1*b*, a group of SW2*b* and GNDb, a group of SW3*b* and GNDb, and a group of SW4*b* and GNDb. Two connectors in each set of connectors are disposed adjacent to each other. The four jump connection pieces SW1*b*/SW2*b* SW3*b* SW4*b* are arranged nearby and electrically connected with the voltage-jump pins SW of the four smart power stages respectively, and are respectively arranged nearby and electrically connected with the input ends of the four windings in the four-phase anti-coupling inductors. The three grounding connectors GNDb are used for realizing electric connection between the grounding pin G of the smart power stage and the third substrate. An input positive connector Vin+1*b* is used for realizing electrical connection between the input pin IN and the third substrate of the smart power stage. Taking the upper magnetic substrate 311 shown in the embodiment as a quadrangle as an example, the three grounding connectors GNDb and one input positive connector Vin+1*b* are arranged adjacent to the four corners of the upper magnetic substrate 311 respectively, but are not limited thereto. A gap exists between every two adjacent sets of connectors. The end surface of each connector is the corresponding pad, namely the ground pad GNDa, the input positive pad Vin+1*a* and the jump pad SWxA. At the same time, referring to FIG. 5G, the ground pad GNDa, the input positive pad Vin+1*a*, and the jump pad SWxA are respectively welded and fixed and electrically connected to corresponding pads (not shown) disposed on the second surface 102 of the first substrate 10. After the magnetic assembly 200 is fixedly connected with the first substrate 10, a gap between each group of connectors can be used for setting more input capacitors Cin, the number of the input capacitors Cin is increased, and the capacitance of the input capacitor Cin is improved. Referring to FIG. 5G, an input capacitor assembly 151/152/153/154/155 is formed by a corresponding input capacitor Cin and a pad not shown on the second surface 102 of the first substrate 10 (not shown).

As shown in FIG. 5E, similar to FIG. 5D, a positive connector Vo+b, a grounding connector GNDb and an input positive connector Vin+1*b* are arranged on the second surface 342 of the third substrate 30; and the connectors are used for realizing electrical connection with the BGA ball corresponding to the electrical network on the second substrate 20. and similarly, the four-phase coupling inductor 302 is taken as an example for description, the connector comprises four output positive connectors Vo+b, the three grounding connectors GNDb and one input positive connector Vin+1*b* are arranged around the lower magnetic substrate 312 and are divided into four groups; which are three combination of three Vo+b and GNDb and one combination of Vin+1*b* and Vo+b are combined. Two connectors in each connector assembly are disposed adjacent to each other. The output positive connector Vo+b is arranged nearby and electrically connected with the output ends of the four windings in the four anti-coupling inductors. Taking the lower magnetic substrate 312 shown in the embodiment as a quadrangle as an example, the three grounding connectors GNDb and one input positive connector Vin+1*b* are arranged adjacent to the four corners of the lower magnetic substrate 312 respectively and directly face and are electrically connected with the connector positions of the same network name on the first surface 341 of the third substrate; or at least the upper and lower parts are overlapped, but not limited thereto. A gap exists between two adjacent sets of connectors, and is used for accommodating part of the output capacitors on the first face 201 of the part of the second substrate 20. the end face of each connector is the corresponding bonding pad, namely the grounding bonding pad GNDc, the input positive pad Vin+1*c* and the output positive pad Vo+c. The grounding pad GNDc, the input positive pad Vin+1*c* and the output positive pad Vo+c are respectively welded and fixed and electrically connected with the bonding pad 141 arranged on the first surface 201 of the second substrate 20. In the embodiment, the connector can be a copper block. The thickness of the copper block on the first surface 341 of the third substrate 30 is close to or greater than the thickness of the upper magnetic substrate 311; the thickness of the copper block on the second surface 342 of the third substrate 30 is close to or greater than the sum of the thickness of the lower magnetic substrate 312 and the thickness of the output capacitor Co, so that the output capacitor Co can be placed under the lower magnetic substrate 312, and the capacitance of the output capacitor Co is improved. and in addition, on the first surface 341 of the third substrate 30, according to the top view of the third substrate, the jump connectors SW1*b*/SW2*b*/SW3*b*/SW4*b* are all arranged close to the right sides of the grounding connectors GNDb or the input positive connectors Vin+1*b* in the respective groups. On the second surface 342 of the third substrate 30, according to the bottom view of the third substrate, the output positive electrical connectors Vo+b are arranged adjacent to the ground connectors GNDb in the respective groups or the right sides of the input positive connectors Vin+1*b*. Therefore, the parasitic resistance of each winding in the magnetic assembly 200 is minimum, the parasitic resistance of each connector is minimum, and the surface area occupied by the connector is minimum.

In the embodiment, in one voltage regulation unit, the SPS combination, the input capacitor assembly, the magnetic assembly and the output capacitor assembly are sequentially stacked from top to bottom, loop parasitic parameters of the high-performance power supply module are reduced, and the occupied area of the high-performance power supply module on the system board is reduced.

In the embodiment, the controller 211 is arranged on the first surface 101 of the first substrate 10, and the controller 212 is arranged on the second surface 102 of the first substrate 10; and the projection of the controller 212 on the first surface 101 coincides with or at least partially coincides with the projection of the controller 211 on the first surface 101. The controllers 211 and 212 are arranged on the first substrate 10, so that the controllers 211 and 212 can be electrically connected with pins related to the smart power stage SPS through the first substrate 10, the number of signal connectors between the first substrate 10 and the second substrate 20 is reduced, and the area occupied by the controllers 211 and 212 on the first surface 101 and the second surface 102 of the first substrate 10 is reduced; so that more area placement smart power stage SPS is arranged on the first surface 101 of the first substrate 10, and more area for placing inductors are arranged on the second surface 102 of the first substrate 10; and the space utilization rate and the conversion efficiency of the high-performance power supply module are improved.

Referring to FIG. 5G, in this embodiment, the connector 1/2/3 is a surface mounted devices, and is attached to the first surface 201 of the second substrate 20 and the second surface 102 of the first substrate 10; signals between the first substrate 10 and the second substrate 20 are electrically connected; and other devices can be placed on the first surface 101 of the first substrate 10 and the position directly faces the connector 1/2/3, so that the space utilization rate of the power module is further improved.

Similarly, the high-performance power supply module disclosed by the embodiment can also only comprise one voltage regulation unit VR Cell, the layout of the SPS in the VR Cell, the structure of the four-phase coupling inductor and the arrangement of the output capacitor have the technical features and advantages of the embodiment, and details are not described herein again.

Embodiment 3

Figure 6A:
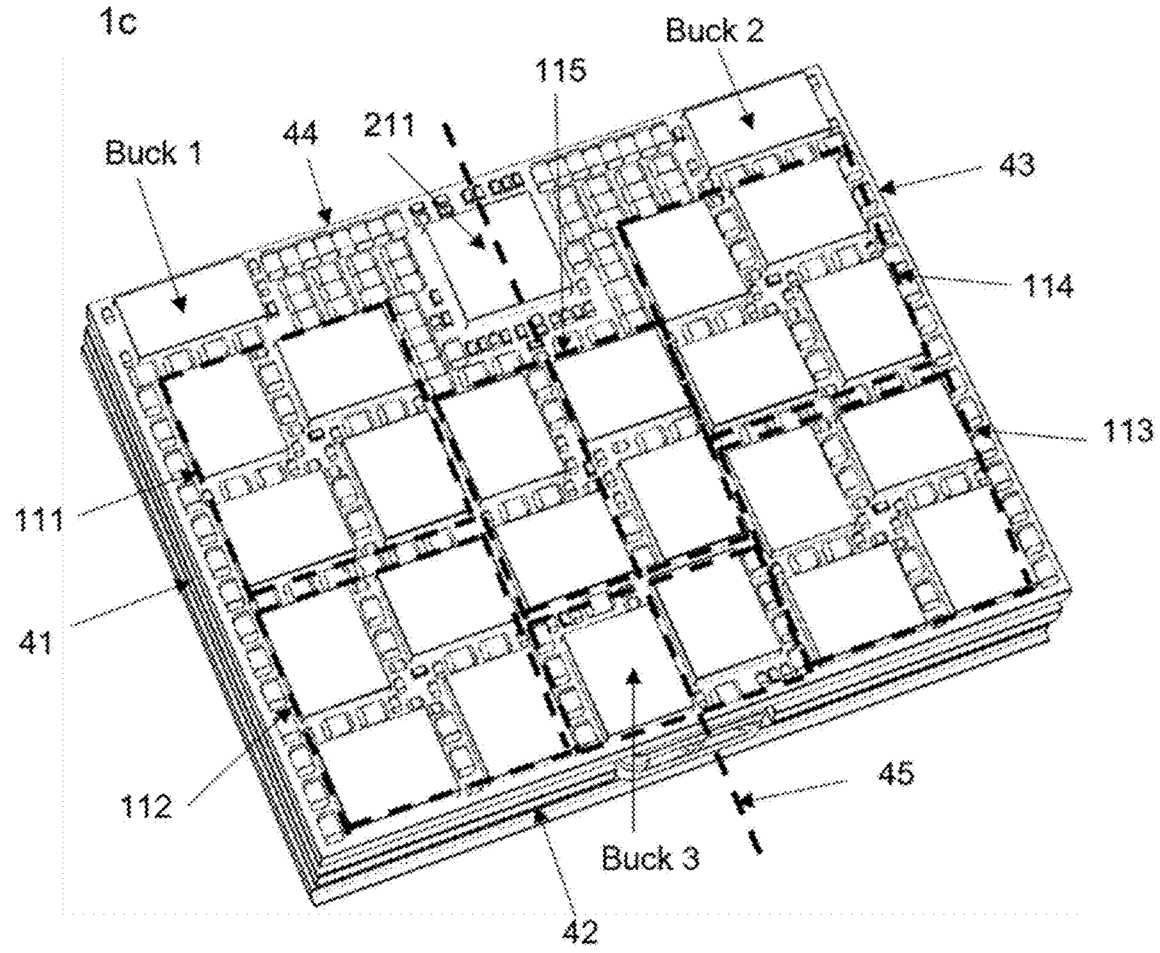
FIG. 6A is a top three-dimensional structure diagram of yet another high-performance power supply module 1*c*.
Figure 6B:
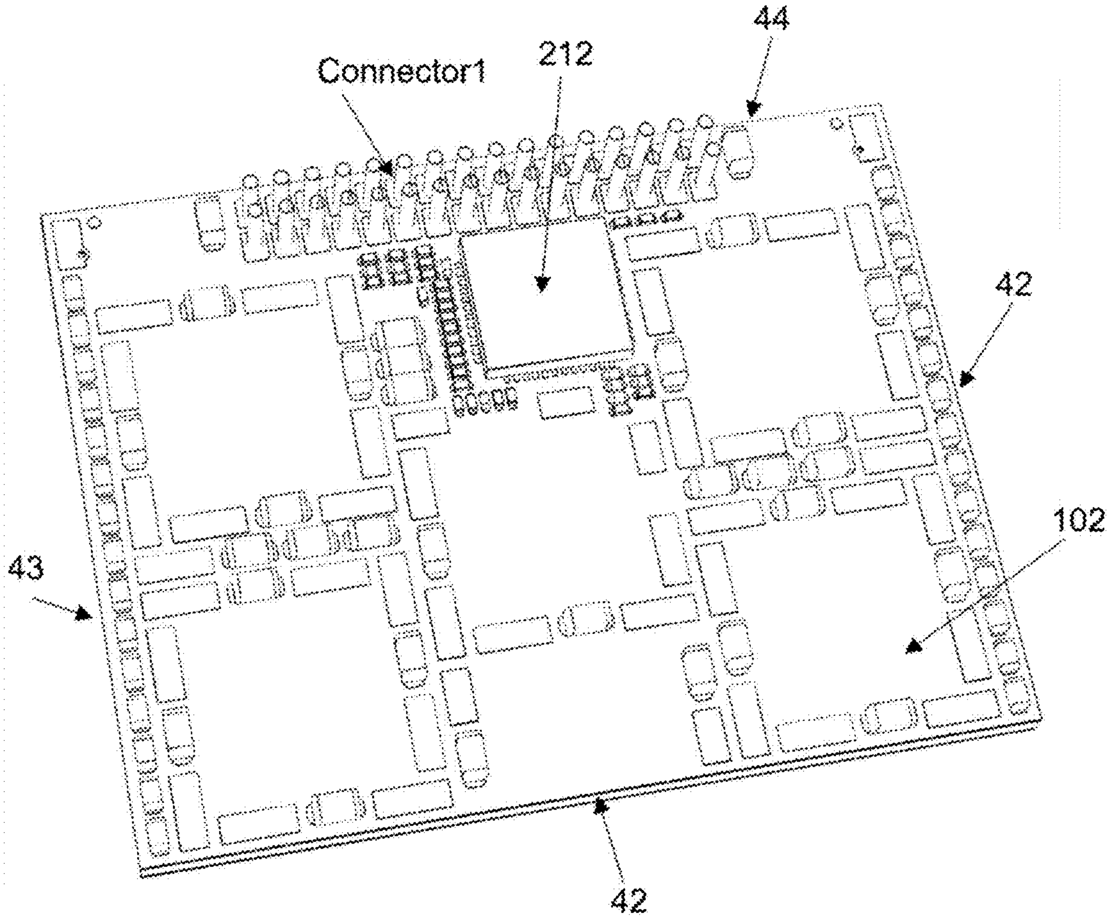
FIG. 6B is a bottom view of the first substrate.
Figure 6C:
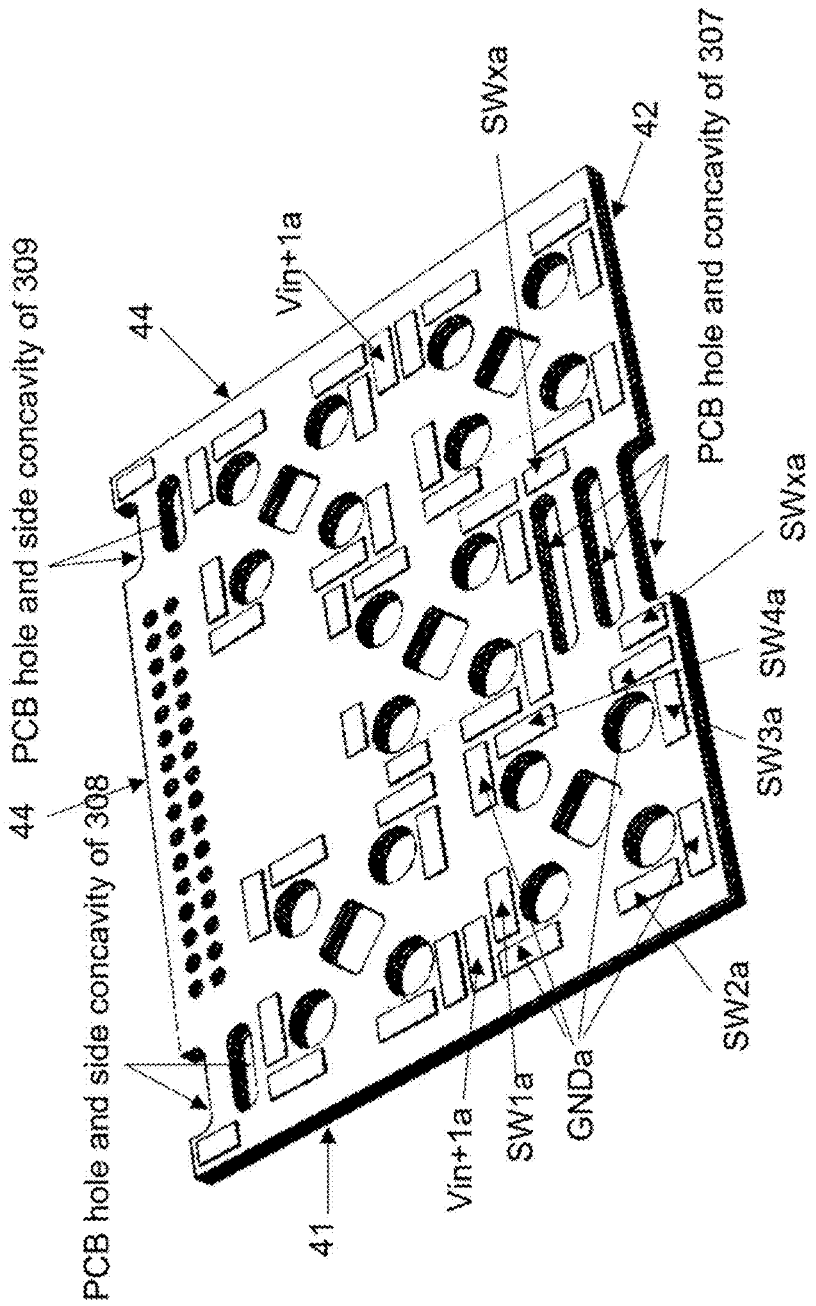
FIG. 6C is a top view appearance diagram of the PCB of the third substrate.

FIG. 6A is a three-dimensional structure diagram of the TOP surface of yet another high-performance power supply module 1*c*; FIG. 6B is a bottom view of the first substrate 10 according to the embodiment; and FIG. 6C is a top view appearance diagram of the third substrate 30 in the embodiment. Referring to FIG. 6A, the difference between the embodiment and FIG. 2A is that the position of the VR Cell 6 is replaced with a two-phase parallel voltage reduction circuit Buck 3 which is original disposed the voltage regulation unit VR Cell 6, so that the advantage of space saving is obtained; the two single-phase voltage reduction units Buck 1 and Buck 2 are respectively placed adjacent to the first side surface 41 and the third side surface 43 of the power supply module; the controller 211 is moved from the top surface of the second substrate 20 to the top surface of the first substrate 10, and the controller 211 is located between the two single-phase voltage reduction units Buck 1 and Buck 2; and the controller 211 is adjacent to the fourth side surface 44 of the power supply module and is located on the center line 45 perpendicular to the fourth side surface 44. Because of the vertical center line 45, the layout of the VR Cell 1 to the VR Cell 5 on the top surface 101 of the first substrate 10 approximately meets a symmetrical relationship with reference to the vertical center line 45; and the layout of the two single-phase voltage reduction units Buck 1 and Buck 2 on the top surface 101 of the first substrate 10 also approximately meets a symmetric relationship The advantage is that the signal pins of the controller 211 are symmetrically and equidistantly connected to the smart power stage in the VR Cell 1 to the VR Cell 4, so that the wiring complexity in the first substrate 10 is greatly reduced. Similarly, the signal pins of the controller 211 can also be symmetrically and equidistantly connected to a smart power stage in the VR Cell 5; or be symmetrically and equidistantly connected to the single-phase Voltage reduction Buck units Buck 1 and Buck 2.

Referring to FIG. 6B, the controller 212 is located on the bottom surface 102 of the first substrate 10, and the position of the controller 212 is directly opposite to or at least partially overlapped with the position of the controller 211 up and down, so that the position encroachment of the controller 211 and the controller 212 on the smart power stage is minimum, and the position encroachment of the inductor is minimized. The connector 1 is also adjacent to and parallel to the first side surface 44 and is located on the center line 45 perpendicular to the fourth side surface 44, so that the signal pins of the controller 211 and the controller 212 can be connected to the Connector 1 in a shortest distance, and the signal pins of the controller 211 and the controller 212 are electrically connected to the third substrate 30 and the second substrate 20 at the shortest distance.

FIG. 6C is a top view of the third substrate 30 in the magnetic assembly 200. The third substrate 30 comprise holes corresponding to the five four-phase coupling inductors 301/302/303/304/305, one two-phase inductor 307 and holes corresponding to the two single-phase inductors 308/309; and the holes are used for the magnetic core column to penetrate through, so that the corresponding inductor is formed. The holes corresponding to one two-phase inductor 307 are placed close to the third side surface of the third substrate 30, so that one hole can be replaced with a plate edge slot, and the space utilization rate of the third substrate 30 is improved; similarly, the holes corresponding to the two single-phase inductors 308/309 are placed close to the fourth side surface of the third substrate 30, so that one hole can be replaced with a plate edge slot. Taking the layout of the position of the four-phase coupling inductor 302 as an example, the bonding pad SWxA used for welding the jump connector and the bonding pad GNDa for welding the grounding connector appear in pairs, and four pairs are added together; and the first pair is SW1*a* and GNDa in the counterclockwise direction; the second pair is SW2*a* and GNDa; the third pair is SW3*a* and GNDa; the fourth pair is SW4*a* and GNDa; are arranged in the counterclockwise direction; and are disposed on the four corners of the quadrilateral upper magnetic substrate 311 of the four-phase coupling inductor 302, and the bonding pad of the welding jump connector SWxA is located on the right side of the bonding pad of the welding grounding connector GNDa. A pad Vin+1*a* for welding the input positive connector is placed adjacent to the GNDa such that the parasitic loop between the input positive connector and the ground connector is minimized. Referring to FIG. 6C, the winding channels of the two-phase inductor 307 are parallel to the second side surface 42, and the pads for two welding the two voltage-jump connectors SWxa, namely the input ends of the two windings of the two-phase inductor 307, are located on the two sides of the winding channel of the two-phase inductor 307, so that the two-phase inductor 307 is two anti-coupling inductors; and the winding channel refers to a PCB located between holes of the two-phase inductor 307. Referring to FIG. 6A, two voltage-jump pins SW of two smart power stages SPS in the Buck 3 are also parallel to the second side surface 42, and the two voltage-jump pins SW of the two smart power stages SPS in the Buck 3 are oppositely arranged, so that the two voltage-jump pins SW of the two smart power stages SPS are connected to the input ends of the two-phase input inductor 307 in a shortest distance. Due to the fact that the PWM phase difference of the two smart power stages SPS meets 180 degrees, the two smart power stages SPS and the two-phase inductor 307 in the Buck 3 form a two-phase parallel voltage reduction circuit with two anti-coupling inductors in a limited space, so that the advantages of large steady-state inductance and small dynamic inductance are obtained; and therefore, the number of output capacitors can be reduced.

The power conversion device can be part of the electronic device or an independent power supply module as long as the technical features and advantages disclosed by the application can be satisfied.

The"equal" or"same" or"equal to" disclosed by the application needs to consider the parameter distribution of engineering, and the error distribution is within +/−30%; the two line segments or the two straight lines are defined as the two line segments or the included angle between the two line segments or the two straight lines is less than or equal to 45 degrees; the included angle between the two line segments or the two straight lines is within the range of [60, 120]; and the definition of the phase error phase also needs to consider the parameter distribution of the project, and the error distribution of the phase error degree is within +/−30%.

What is claimed is:

1. A high-performance power supply module, comprising:

at least one voltage regulation unit, wherein the at least one voltage regulation unit comprises an SPS combination, a four-phase anti-coupling inductor, an output capacitor assembly, a first substrate and a second substrate, wherein the first substrate comprises a first surface and a second surface which are opposite to each other, and the second substrate comprises a first surface and a second surface which are opposite to each other;

wherein the SPS combination is arranged on the first surface of the first substrate, and the four-phase anti-coupling inductor is arranged between the second surface of the first substrate and the first surface of the second substrate;

wherein the output capacitor assembly is arranged on the second surface of the second substrate;

wherein the SPS combination comprises four smart power stages, the four smart power stages are arranged according to four-leaf windmill shapes, each of the four smart power stages comprises a voltage-jump pin, and each voltage-jump pin is arranged at the top end of the corresponding windmill blade;

wherein the four-phase anti-coupling inductor comprises a magnetic core and an inductor frame, wherein a groove space is provided between the surface of the magnetic core and the surface of the frame, and at least a part of the groove space is used for accommodating the output capacitor assembly.

2. The high-performance power supply module of claim 1, wherein each of the four smart power stages further comprises an input positive pin, a grounding pin and a signal pin, the voltage-jump pin, the input positive pin, the grounding pin and the signal pin are sequentially arranged in the same direction.

3. The high-performance power supply module of claim 2, further comprising:

an input capacitor, wherein the input capacitor is provided with two sides of each of the four smart power stages and is arranged adjacent to the input positive pin and the grounding pin.

4. The high-performance power supply module of claim 1, wherein the inductance frame comprises four inductor windings, a grounding electrical connector, an input positive electrical connector, output positive electrical connectors, and a jump connector, wherein one end of each of the four inductor windings is connected with a corresponding output positive electrical connector, and the other end of each of the four inductor windings is connected with a corresponding jump connector;

wherein each of the output positive electrical connectors is disposed adjacent to a jump connector corresponding to another inductive winding.

5. The high-performance power supply module of claim 4, wherein the inductor frame is quadrilateral, and the inductor frame further comprises a grounding pad, an input positive pad, an output positive pad and a jump pad, wherein a grounding pad, an input positive pad, an output positive pad, a jump pad, an input positive pad and a grounding pad are sequentially arranged on the four sides of the top surface of the inductor frame;

wherein a ground pad, an input positive pad, an output positive pad, an input positive pad, and a ground pad are sequentially arranged on four sides of the bottom surface of the inductor frame.

6. The high-performance power supply module of claim 5, wherein each of the four smart power stages further comprises an input positive pin, a grounding pin, and a signal pin, wherein the voltage-jump pin, the input positive pin, the grounding pin and the signal pin are sequentially arranged in the same direction, and the projection of the jump pad on the first surface of the first substrate at least partially coincides with the projection of the voltage-jump pin on the first surface of the first substrate.

7. The high-performance power supply module of claim 4, further comprising:

a ball grid array, wherein the ball grid array is arranged on the second surface of the second substrate, and the ball grid array is electrically connected with the grounding electrical connector, the input positive electrical connector and the output positive electrical connector through a second substrate.

8. The high-performance power supply module of claim 4, wherein the four inductor windings corresponding to the voltage regulating units are integrated in a third substrate, and the magnetic cores corresponding to the voltage regulating units are all Buckled on the third substrate.

9. The high-performance power supply module of claim 1, wherein the SPS combination is provided with four pulse width modulation signals, and each pulse width modulation signal is used for controlling one smart power stage;

wherein the four pulse width modulation signals are sequentially staggered by 90 degrees, and the duty ratio of the four pulse width modulation signals is within the range of 15%~35%.

10. The high-performance power supply module of claim 1, wherein the at least one voltage regulating unit includes six voltage regulating units which are respectively a first voltage regulating unit to a sixth voltage regulating unit, wherein input ends of the six voltage regulating units are electrically connected in parallel, and output ends of the first voltage regulating unit to the fourth voltage regulating unit are electrically connected in parallel to form a first power supply path, wherein the fifth voltage regulating unit forms a second power supply path, and the sixth voltage regulating unit forms a third power supply path.

11. The high-performance power supply module of claim 10, further comprising:

a first side face, a second side face, a third side face and a fourth side face, wherein the first side face and the third side face are opposite, and the second side face and the fourth side face are opposite;

the first voltage regulating unit and the second voltage regulating unit are arranged adjacent to the first side face;

the third voltage regulating unit and the fourth adjusting unit are arranged close to the third side face;

the fifth voltage regulating unit is arranged between the first voltage regulating unit and the third voltage regulation unit, and is adjacent to the second side face; and the sixth voltage regulating unit is arranged between the second voltage regulating unit and the fourth voltage regulating unit, and is arranged adjacent to the fourth side face.

12. The high-performance power supply module of claim 10, further comprising:

a controller, wherein the controller is arranged in a groove space corresponding to the voltage regulating unit corresponding to the first power supply path.

13. The high-performance power supply module of claim 10, further comprising:

two single-phase voltage reduction units, wherein the two single-phase voltage reduction units respectively form a power supply path;

the two single-phase voltage reduction units respectively include one smart power stage; and the two single-phase voltage reduction units respectively include one single-phase inductor, or the two single-phase voltage reduction units share one two-phase inductor.

14. The high-performance power supply module of claim 1, wherein the at least one voltage regulating unit includes five voltage regulating units which are respectively a first voltage regulating unit to a fifth voltage regulating unit, wherein input ends of the five voltage regulating units are electrically connected in parallel, and output ends of the first voltage regulating unit to the fourth voltage regulating unit are electrically connected in parallel to form a first power supply path, and the fifth voltage regulating unit forms a second power supply path;

wherein the high-performance power supply module further comprises a two-phase parallel voltage reduction unit and two single-phase voltage reduction units;

wherein the two-phase parallel voltage reduction unit forms a third power supply path, the two-phase parallel voltage reduction unit comprises two smart power stages and one two-phase anti-coupling inductor;

the two smart power stages are provided with two pulse width modulation signals, and the two pulse width modulation signals are staggered by 180 degrees;

the input ends of the two anti-coupling inductors are electrically connected with the two smart power stages, respectively.

15. The high-performance power supply module of claim 14, wherein the fifth voltage regulating unit is arranged in the middle of the high-performance power supply module, and the first voltage regulating unit to the fourth voltage regulating unit are arranged around the fifth voltage regulation unit.

16. The high-performance power supply module of claim 14, wherein the high-performance power supply module wraps two controllers, the two controllers are arranged on two faces of the first substrate respectively, and the two controllers coincide or partially overlap along a projection position on the first substrate.

17. The high-performance power supply module of claim 16, wherein the two controllers, the fifth voltage regulating unit, and the two-phase parallel voltage reduction unit are arranged along a center line of the high-performance power supply module, and the first voltage regulating unit to the fourth voltage regulating unit and the two single-phase voltage reduction units are symmetrically arranged on two sides of the center line.

18. The high-performance power supply module of claim 14, wherein inductors corresponding to the voltage regulating unit, the two-phase parallel voltage reduction unit, and the single-phase voltage reduction unit respectively include the inductor winding and the magnetic core, wherein the four inductor windings are all integrated in one third substrate, and the magnetic cores are all buckled on the third substrate.

19. The high-performance power supply module of claim 1, further comprising:

a signal electrical connector, the signal electrical connector being disposed between the first substrate and the second substrate and electrically connected to the first substrate and the second substrate, and the signal electrical connector being used for transmitting a signal.

* * * * *